United States Patent
Huang et al.

(10) Patent No.: US 7,491,595 B2
(45) Date of Patent: Feb. 17, 2009

(54) CREATING HIGH VOLTAGE FETS WITH LOW VOLTAGE PROCESS

(75) Inventors: Chin Huang, Temecula, CA (US); Jeff Hintzman, Corvallis, OR (US); James Weaver, Corvallis, OR (US); Zhizhang Chen, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 572 days.

(21) Appl. No.: 11/176,033

(22) Filed: Jul. 6, 2005

(65) Prior Publication Data

US 2007/0010052 A1     Jan. 11, 2007

(51) Int. Cl.
*H01L 21/8238* (2006.01)

(52) U.S. Cl. .............. 438/199; 438/229; 438/230; 438/286; 438/299; 257/E27.067

(58) Field of Classification Search ............... 438/199, 438/223, 224, 229, 230–232, 286, 299; 257/E27.067
See application file for complete search history.

(56) References Cited

U.S. PATENT DOCUMENTS

| | | | |
|---|---|---|---|
| 5,047,358 A | 9/1991 | Kosiak et al. | |
| 5,204,541 A | 4/1993 | Smayling et al. | |
| 5,504,451 A | 4/1996 | Smayling et al. | |
| 5,880,502 A | 3/1999 | Lee et al. | |
| 6,133,077 A | 10/2000 | Randazzo | |
| 6,413,824 B1* | 7/2002 | Chatterjee et al. | 438/275 |
| 7,019,377 B2* | 3/2006 | Tsuchiko | 257/476 |
| 2005/0106825 A1* | 5/2005 | You et al. | 438/301 |
| 2006/0057784 A1* | 3/2006 | Cai et al. | 438/149 |
| 2006/0113625 A1* | 6/2006 | Bude et al. | 257/491 |
| 2007/0040212 A1* | 2/2007 | Cai et al. | 257/328 |

* cited by examiner

*Primary Examiner*—Michelle Estrada

(57) ABSTRACT

An integrated circuit (IC) includes a high voltage first-conductivity type field effect transistor (HV-first-conductivity FET) and a high voltage second-type field effect transistor (HV-second-conductivity FET). The HV first-conductivity FET has a second-conductivity-well and a field oxide formed over the second-conductivity-well to define an active area. A first-conductivity-well is formed in at least a portion of the active area, wherein the first-conductivity-well is formed to have the capability to operate as a first-conductivity-drift portion of the HV-first-conductivity FET. The HV second-conductivity FET has a first-conductivity-well and a field oxide formed over the first-conductivity-well to define an active area. A channel stop region is formed in at least a portion of the active area, wherein the channel stop region is formed to have the capability to operate as second-conductivity-drift portions of the HV-second-conductivity FET.

17 Claims, 12 Drawing Sheets

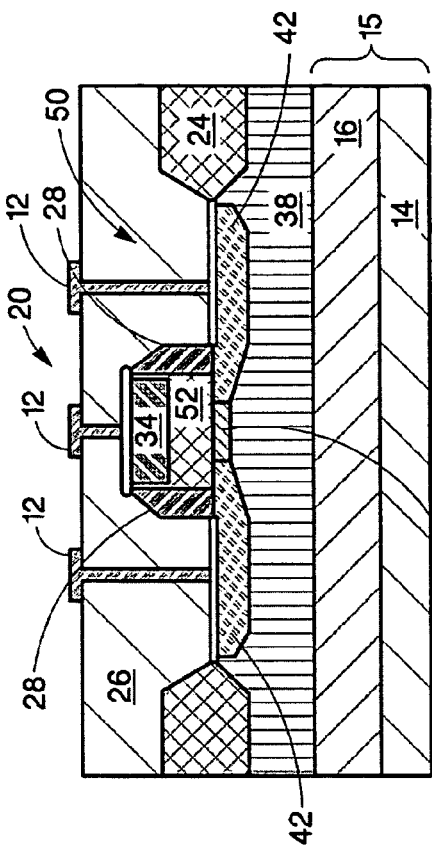
Fig. 1 —PRIOR ART—
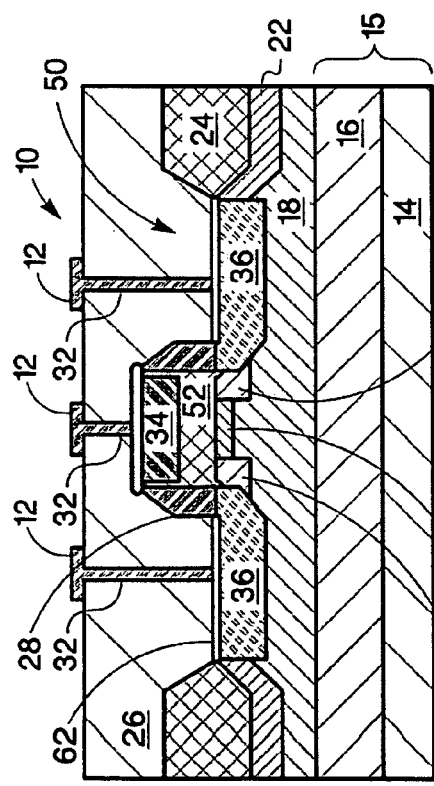
Fig. 2 —PRIOR ART—
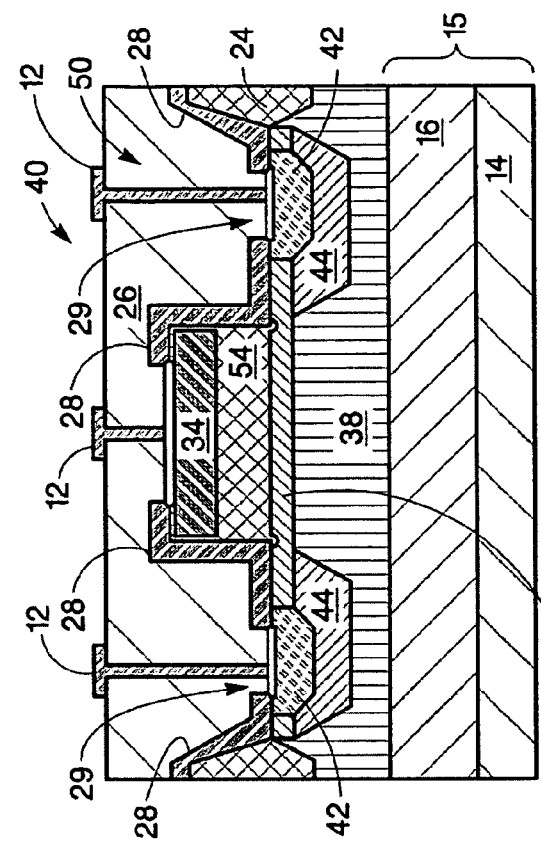
Fig. 3
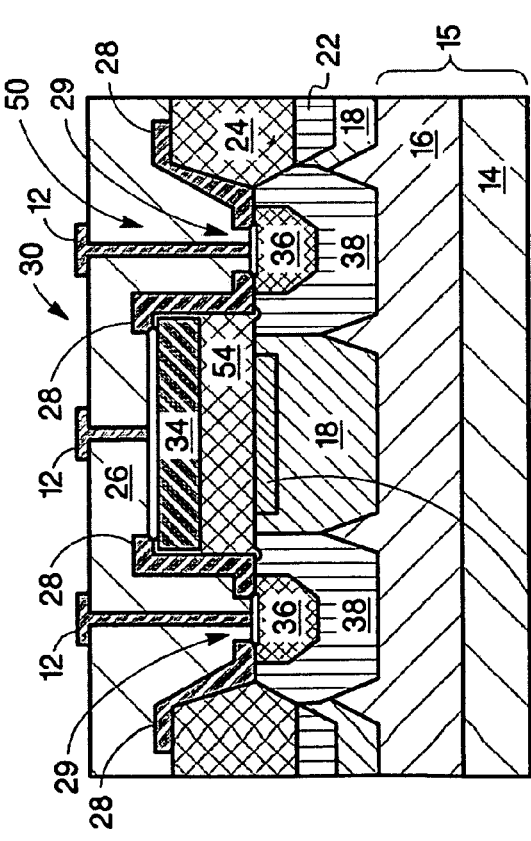
Fig. 4

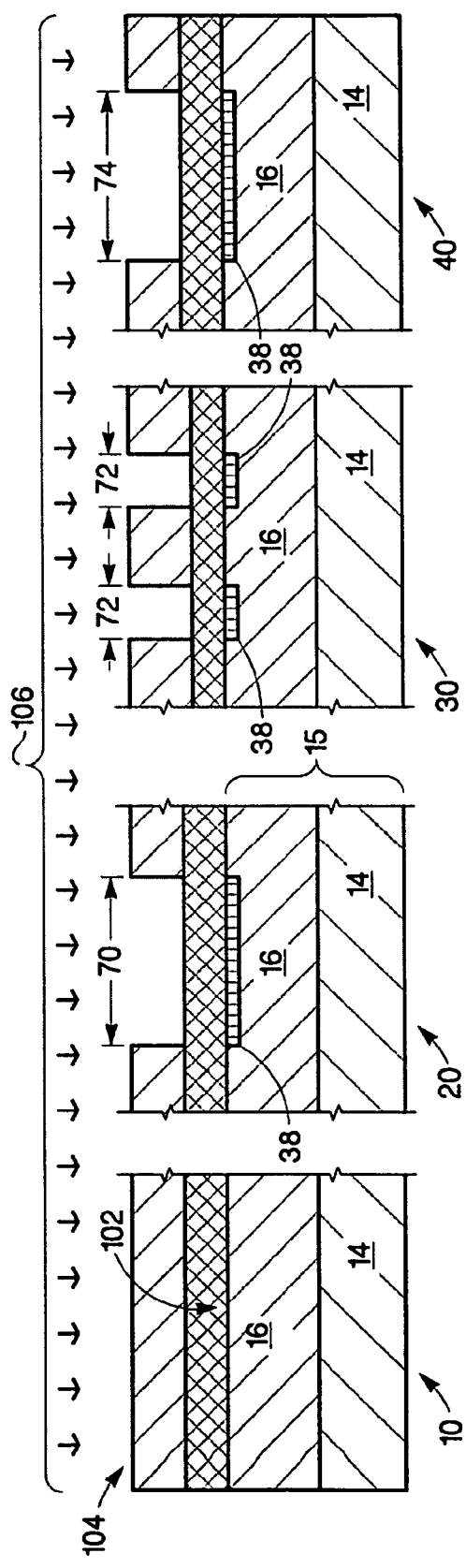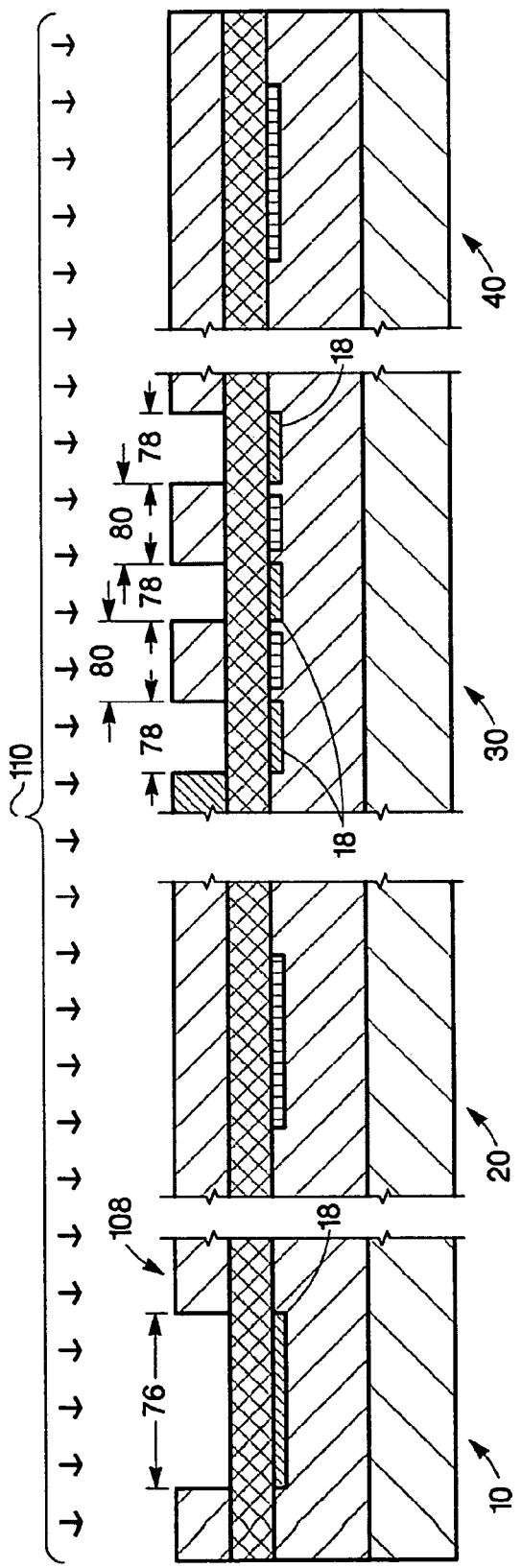

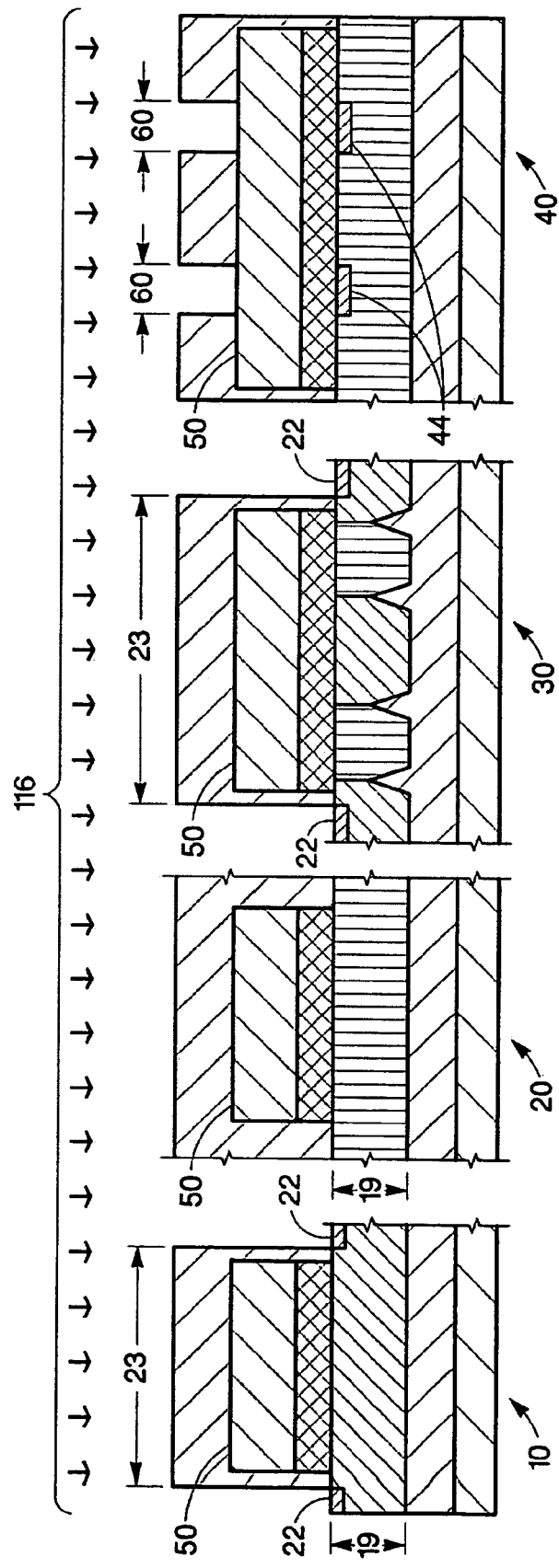
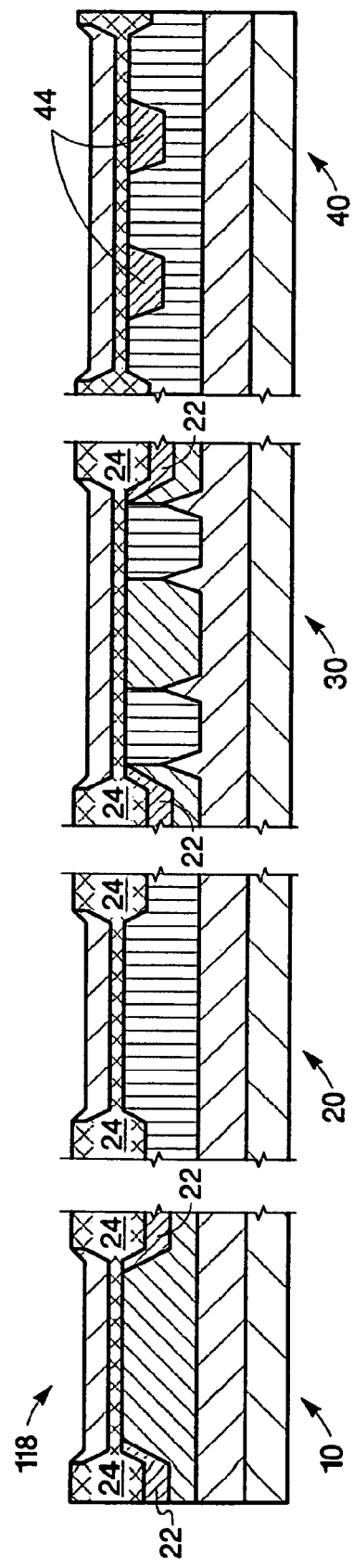
Fig. 12E
Fig. 12F

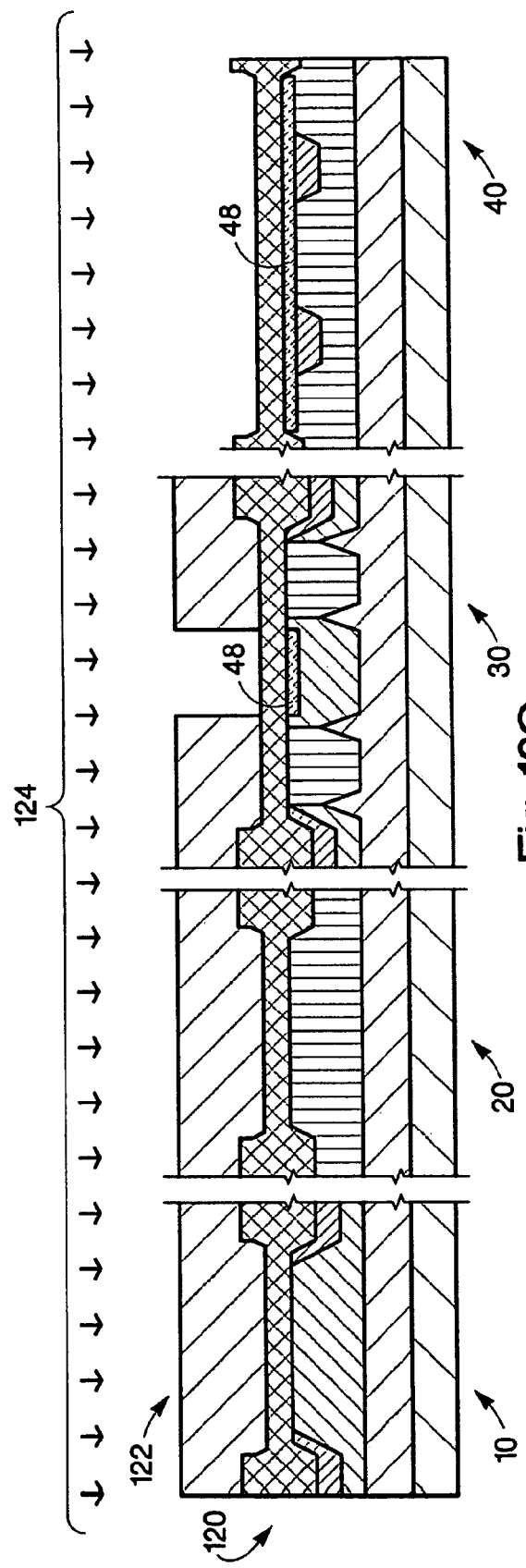
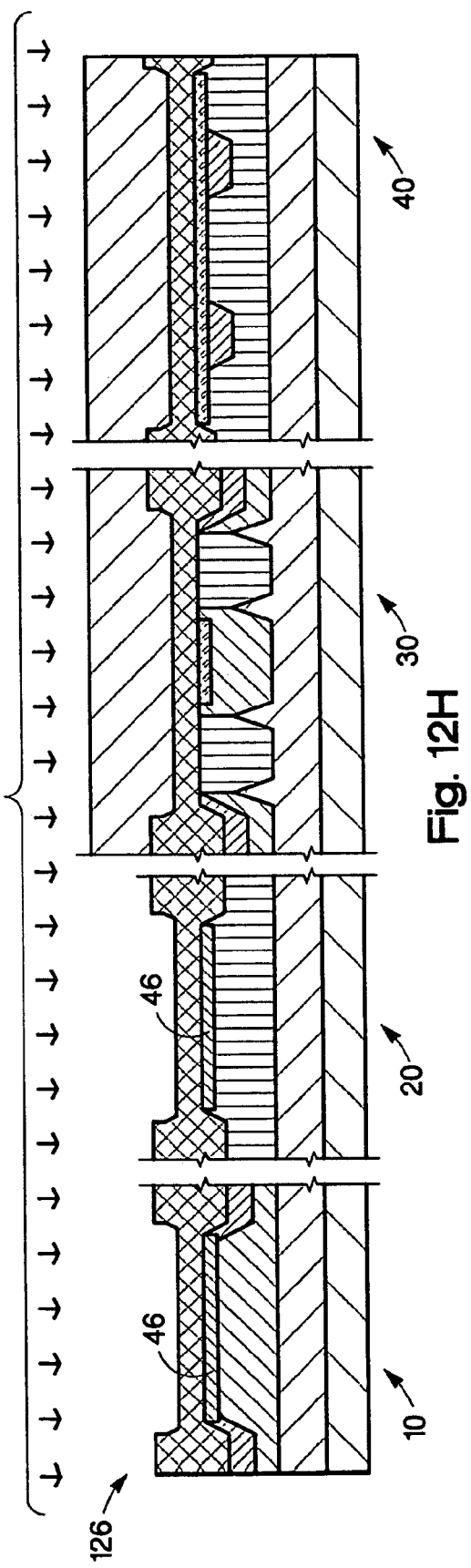
Fig. 12G
Fig. 12H

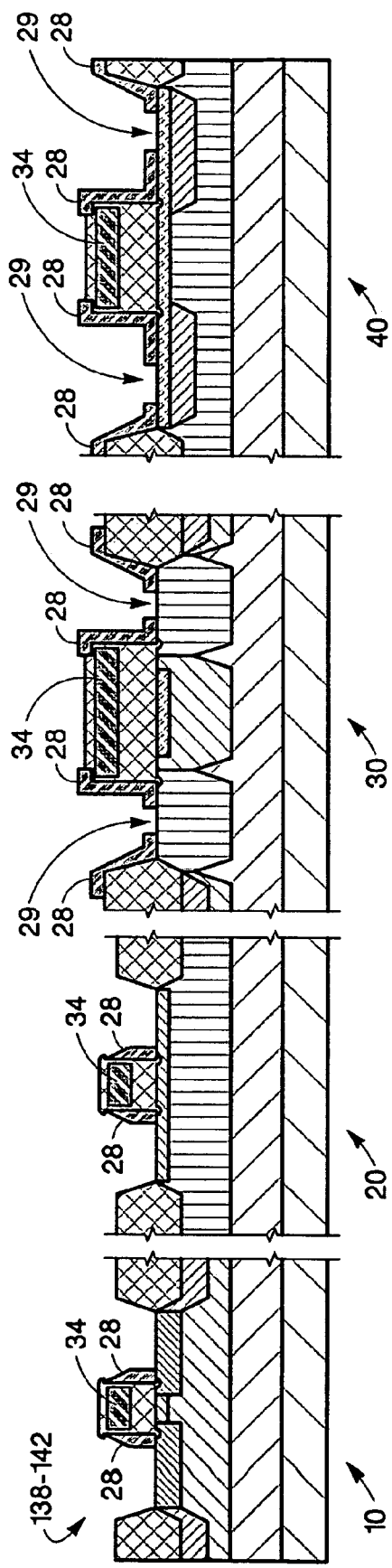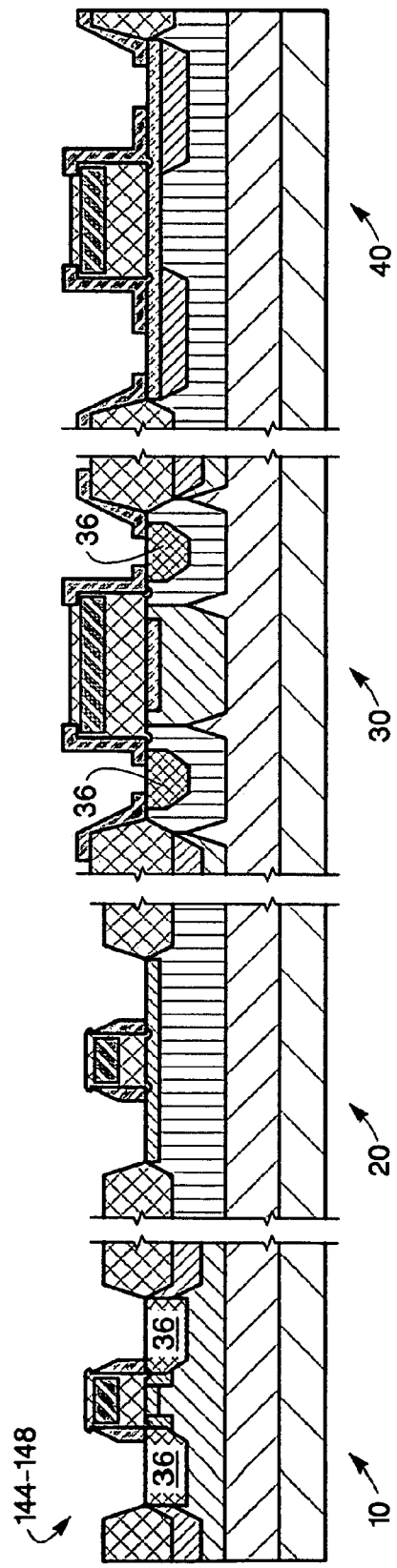
Fig. 12K
Fig. 12L

CREATING HIGH VOLTAGE FETS WITH LOW VOLTAGE PROCESS

BACKGROUND OF THE INVENTION

New applications in flat panel displays, projectors, ink jet printers, and many other technologies are driving the need to add high voltage devices with conventional low voltage complimentary metal oxide semiconductor (CMOS) technologies. One major challenge is to combine the high and low voltage devices together on the same integrated circuit (IC) economically. One difficulty in doing so has been the inability to achieve good electrical characteristics for both types of devices. Generally, when a low voltage CMOS process is developed, it is optimized for low voltage operation. When such a process is modified to produce high voltage parts, the performance of the low voltage devices suffers due to the need to perform various tradeoffs when the new process steps added. Conventional hybrid CMOS processes add additional steps and masks to the low voltage CMOS process which not only increases costs, but limits the number of suppliers available as not all IC foundry suppliers may be able to perform the additional process steps. Therefore, it is desirable to have an improved process for forming both high and low voltage CMOS devices in the same integrated circuit with few changes to established processes for making the low voltage CMOS devices.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar parts through the several views.

FIG. 1 is a cross-sectional view of a conventional symmetrical low voltage NMOS transistor.

FIG. 2 is a cross-sectional view of a conventional symmetrical low voltage PMOS transistor.

FIG. 3 is a cross-sectional view of an embodiment of a symmetrical high voltage NMOS transistor.

FIG. 4 is a cross-sectional view of an embodiment of a symmetrical high voltage PMOS transistor.

DETAILED DESCRIPTION

Figure 9:
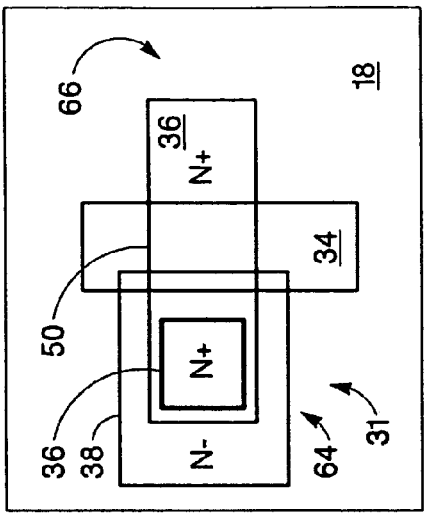
FIG. 9 is a simplified top view of an embodiment of a non-self-aligned asymmetrical high voltage NMOS transistor.

Conventional CMOS processes which combine high voltage (HV) and low voltage (LV) devices typically use additional process steps over existing low voltage CMOS processes to create n-drift and p-drift regions for the HVCMOS devices. This usually requires at least two additional masks, 2 implantations and 1 diffusion thermal cycle over a baseline LVCMOS foundry process flow. A new technique is described herein as a cost effective process that eliminates these extra steps to create new HVCMOS devices along with LVCMOS devices. In one embodiment, the N-well of the LVCMOS process is used as the n-drift region of the HVNMOS and the local channel stop implant of the LVCMOS process is modified to a sequential chain implant with a unique design rule violation to create the p-drift region of the HVPMOS. By using this new technique to creating the drift regions, the LVCMOS devices are essentially unaltered, thus eliminating the need to re-characterize the LVCMOS devices. Thus, no new spice modeling work is needed for the existing low voltage devices.

The semiconductor devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in silicon on insulator (SOI), germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although the embodiments illustrated herein are shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by preferred embodiments directed to active devices, it is not intended that these illustration be a limitation on the scope or applicability of the present invention. It is not intended that the active devices of the present invention be limited to the physical structures illustrated. These structures are included to demonstrate the utility and application of the present invention to presently preferred embodiments.

MOSFET (Metal Oxide Silicon Field Effect Transistor) devices may fall within one or more classes of devices, such as high voltage and low voltage devices. Low voltage MOSFETs may be configured to operate at a voltage generally less than 5 volts, such as by operating at equal to or less than approximately 3-4 volts, and high voltage MOSFETs may be configured to operate at less than generally 40 volts, such as by operating at equal to or more than about 15-20 volts. Devices such as these may have varying structural differences, such differing channel regions with differing dopant concentrations, to provide particular capabilities to operate at particular voltages, and may additionally have varying formation processes. For example, it may be desirable to form a CMOS (complimentary metal oxide semiconductor) IC (integrated circuit) process to allow having one or more MOSFETs formed on substrates that may be capable of operating at high voltages, and one or more MOSFETs that may be capable of operating at low voltages. However, the formation of active devices such as these may involve modifying a low voltage formation process with additional masking, implanting and thermal cycle processes. These additional process steps may disrupt the conventional process flow and may involve the additional expenditure of time or expense.

In at least one embodiment of the new technique, one or more CMOS processes may be utilized to form at least a portion of an IC device exhibiting these high voltage characteristics. Although an exemplary new process will be explained in greater detail herein, one or more process steps may be altered, combined or eliminated such as to provide a desired particular functionality and still be within the spirit and scope of the invention.

Additionally, other desired particular functionality may be provided that may enable the production of IC devices being asymmetric or symmetric with respect to the layout of the high and low voltage devices on the IC device. Symmetric means that the drain and source are similarly implemented and may typically be exchanged during layout. Asymmetric refers to a device in which the drain is formed differently than the source and typically may not be exchanged for each other during layout. This may provide desirable design flexibility and may increase the number of variations of a layout that may be formed as part of an IC device, for example.

Exemplary Devices:

Illustrated in FIGS. 1-4 are cross-sectional or cut-away views of partially formed symmetrical MOSFETs, in accordance with at least one embodiment. Illustrated in FIG. 1 is a conventional low voltage n-channel MOSFET 10 (LVNMOS or LVNFET being common terms). Illustrated in FIG. 2 is a conventional low voltage p-channel MOSFET 20 (LVPMOS and LVPFET being common terms). Illustrated in FIG. 3 is a high voltage NMOSFET 30 (HVNMOS or HVNFET being common terms). Illustrated in FIG. 4 is a high voltage PMOSFET 40 (HVPMOS and HVPFET being common terms). All of the MOSFETs shown in FIGS. 1-4 may be integrated on a single integrated circuit (IC) chip, and may be formed in combination with other circuitry (such as MEMs devices) such as to form a functional system (such as a spatial light modulator), although in alternative embodiments they may be formed on physically separate IC devices. For instance, the HVNMOS 30 may be formed with only LVNMOS 10 with a simplified process to create NMOS IC devices. Further, some applications may require the LVNMOS 10 and LVPMOS 20 but only one of the HVPMOS 40 or HVNMOS 30 type devices. Accordingly, the process may be simplified as required to only create those devices needed in a particular application.

Referring now to FIG. 1, LVNMOS 10 may include a substrate 15. Substrate 15 may be comprised of a layer of heavily doped silicon, which may have an epi layer formed thereon. For example, the substrate 15 may include a P+ doped substrate 14 with a P– epi layer 16. However, the claimed subject matter is not so limited, and substrate 15 may comprise one or more other semi-conductive materials or combinations thereof, including SOI or germanium, for example. Further, for the purposes of simplification, a lightly doped (having a small concentration of impurities) material or region will be referred to as the dopant type (first-conductivity, second-conductivity, n, p, N, or P) with a minus (–) sign appended to it. A heavily doped material or region will be referred to as the dopant type (first-conductivity, second-conductivity, n, p, N, or P) with a plus (+) sign appended to it. Those of skill in the art will appreciate that the dopant type may be swapped and functional devices made of the alternate type typically by varying the dopant materials and concentrations accordingly. Thus, while the following description of particular exemplary embodiments is done with respect to a P-type substrate, one of ordinary skill will realize that the starting material can be an N-type substrate.

For instance, the following description describes a process in which the N-well of a conventional low voltage (LV) CMOS process is used as the n-drift of a high voltage (HV) NFET. Further, the local channel stop implant is modified to using a chained implant of varying high to low energies to create the p-drift region of the HVPFET. By starting with an N-type substrate, the n-drift of the HVNFETs and the p-drift of the HVPFETs are formed as described above. Thus, a first conductivity-type material may be either a P or N type material and a second conductivity-type material may be the respective alternative P or N type material.

In FIG. 1, LVNMOS 10 has a P-well 18 diffused into the substrate 15 along with channel stops 22 surrounding active area 50. Active area 50 is a region defined in an opening of field oxide (FOX) 24. Within the active area 50 are N+ implants 36 and LV threshold adjust implant 46 (LV $V_t$ adjust), which is disposed under LV gate oxide 52. A set of spacers 28 are adjacent to the LV gate oxide 52 and the gate 34, which is typically made of polysilicon. Typically, a silicide layer 62 is created on the N+ implants 36 and gate 34 to allow for interfacing to metal 12 through contacts 32 through TEOS (tetraethylorthosilicate deposition of $SiO_2$) 26. LDD 56 is a lightly doped drain diffusion under the LV gate oxide 52.

In FIG. 2, the LVPMOS 20 differs from LVNMOS 10 in that the active area 50 includes P+ implants 42 in an N-well 38. Further, there is no LDD 56 diffusion nor channel stops 22 as with LVNMOS 10.

In FIG. 3, the HVNMOS 30 has a P-well 18 diffused into substrate 15. The field oxide 24 is formed over the P-well 18 to define an active area 50. N-wells 38 are formed in at least a portion of the active area 50. The N-wells 38 are formed to have the capability to operate as the n-drift portions of the HVNMOS. A HV gate oxide 54 is formed over the P-well 18 in between the N-wells 38 and over a portion of each of the N-wells 18 in the active area 50. A plurality of spacers 28 are formed on opposing sides of the HV gate oxide 54. The spacers 28 define openings 29 over the N-wells 38. The openings have N+ implants 36 in the N-wells 38. The active area 50 is surrounded by a channel stop 22 in P-well 18, except in the HV gate oxide 54 region. The P-well 18 in the gate area beneath the HV gate oxide 54 has a HV threshold voltage adjust implant 48 (HV $V_t$ adjust). The highly resistive N-well 38 implant region, between the gate and drain region, allows the critical electric field for silicon, which is responsible for electron-hole pair generation by impact ionization, to be reached at drain voltages well above the conventional LVNMOS 10 breakdown.

In FIG. 4, the HVPMOS 40 has an N-well 38 diffused into the substrate 15. A field oxide 24 is formed over the N-well 38 to define an active area 50 for the transistor. A pair of p-drift regions 44 is formed in at least a portion of the active area 50. The p-drift regions 44 are formed during the channel stop formation of LVNMOS 10 to have the capability to operate as high resistance p-drift portions of the HVPMOS 40. A HV gate oxide 54 is formed over the N-well 38 and portions of each of the p-drift regions 44 in the active area 50. A plurality of spacers 28 are formed on opposing sides of the HV gate oxide 54 and gate 34. The spacers define openings 29 over the p-drift regions 44. The openings each have a P+ implant 42 in the p-drift regions 44. The p-drift regions 44 are formed using a sequential chain implant from higher to lower energies to form a lightly graded-doped region between the gate and drain region. The presence of this lightly graded-doped region offers the ability to achieve high off-state breakdown voltage as compared to conventional LVPMOS 20.

Figure 5:
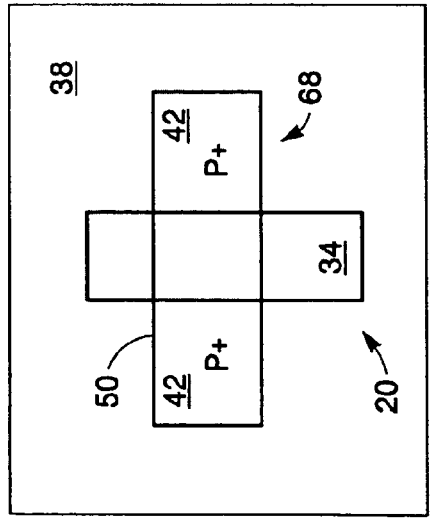
FIG. 5 is a simplified top view of a conventional symmetrical self-aligned low voltage PMOS transistor.

FIG. 5 is a top view illustration of a conventional LVPMOS 20 having an active area 50 in an N-well 38. The active area 50 has two P+ implants 42 separated by a gate 34 to form a self-aligned transistor. The transistor is self-aligned in that the gate is used as a mask to define the source/drain regions 68 during the P+ implants 42.

Figure 6:
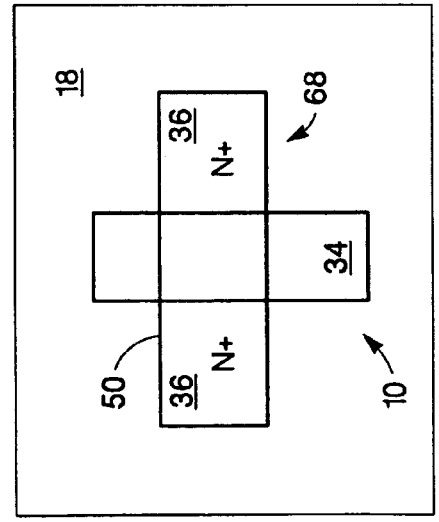
FIG. 6 is a simplified top view of a conventional symmetrical self-aligned low-voltage NMOS transistor.

FIG. 6 is a top view illustration of a LVNMOS 10 having an active area 50 in a P-well 18. The active area 50 has two N+ implants 36 separated by a gate 34 to form a self-aligned transistor. The gate is used as a mask to define the source/drain regions 68 during the N+ implants 36. Both LVNMOS 10 and LVPMOS 20 are symmetrical transistors in that the source and drain regions 36 may be interchanged during layout and operation.

Figure 7:
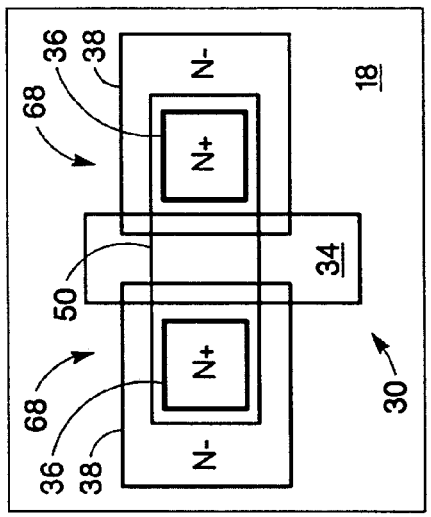
FIG. 7 is a simplified top view of an embodiment of a non-self-aligned symmetrical high voltage NMOS transistor.

FIG. 7 is a top view illustration of a symmetric HVNMOS 30 having an active area 50 in a P-well 18. The source/drain regions 68 each include an N-well 38 configured to be used as an n-drift region and an N+ implant 36. The gate 34 is disposed partially over each N-well 38 and the P-well 18. The transistor is non-self aligned in that the gate 34 is formed after the N-wells 38 are fabricated in the IC. Thus, the relative location of the gate 34 to the overlap of the N-wells 38 relies on the tolerance of the alignment equipment. Further, the N+ implants 36 are located by a spacer 28 (not shown) which has an opening 29 (not shown) to allow the N+ implants to occur. Thus, the location of the source/drain regions 68 may vary somewhat with respect to the location of the gate 34 from part to part.

Figure 8:
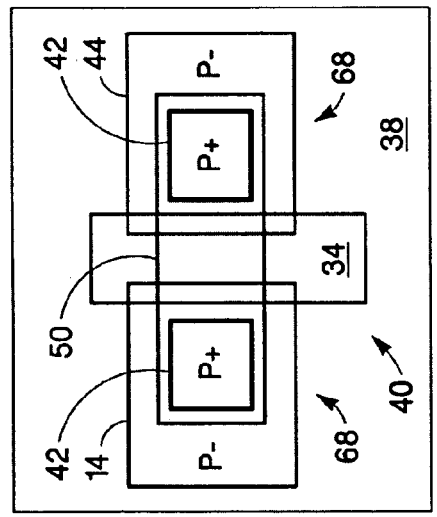
FIG. 8 is a simplified top view of an embodiment of a non-self-aligned symmetrical high voltage PMOS transistor.

FIG. 8 is a top view illustration of a symmetric HVPMOS 40 having an active area 50 in an N-well 38. The active area 50 has source/drain regions 68 on opposing sides of gate 34. The source/drain regions 68 each have a p-drift region 44 that is formed by a sequential chain implant that is used to also form channel stops for the LVNMOS 10 transistor. The p-drift regions 44 each include a P+ implant 42. The P+ implant 42 is located by an opening 29 (not shown) defined in a spacer 28 (not shown), thus the transistor is considered non-self aligned. Also, the p-drift regions 44 are fabricated in the N-well 38 before the gate 34 is located partially over each p-drift region 44 and the N-well 38.

FIG. 9 is a top view illustration of an asymmetric HVNMOS 31 with an active area 50 defined in a P-well 18. In the active area 50, there is only one n-drift region formed from a N-well 38 and used as the drain 64 of the transistor. The N-well 38 includes an N+ implant 36. The source 66 is formed by an N+ implant 36 that fills the active area between the gate (including a spacer 28, see FIG. 13) and field oxide 24 (not shown) that defines the active area 50. Prior to the N+ implant 36 in the source 66, the transistor's source active area has been subjected to a lightly doped drain (LDD) diffusion 56, a portion of which remains under gate 34 adjacent to the source 66.

Figure 10:
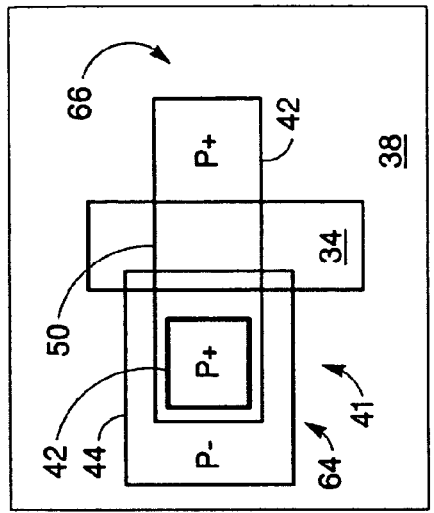
FIG. 10 is a simplified top view of an embodiment of a non-self-aligned asymmetrical high voltage PMOS transistor.

FIG. 10 is a top view illustration of an asymmetric HVPMOS 41 with an active area 50 defined in an N-well 38. In the active area 50, there is only one p-drift region 44 formed from sequential chain channel stop implant and used as the drain 64 of the transistor. The p-drift 44 includes a P+ implant 42. The source 66 is formed by a P+ implant 42 that fills the active area between the gate (including a spacer 28, see FIG. 14) and field oxide 24 (not shown) that defines the active area 50.

More generally, embodiments on an integrated circuit have a set of first-conductivity-wells and second-conductivity-wells formed on a substrate. The substrate includes a self-aligned LV first-conductivity FET transistor having first-conductivity+ active areas and a set of channel stops formed in a first second-conductivity-well. A non self-aligned HV-first-conductivity FET transistor is formed in a second second-conductivity-well wherein a drain region is defined by a first-conductivity-drift region formed during the creation of the set of first-conductivity-wells and a first-conductivity+ active area defined by a spacer spanning the drain region and partially a gate region. The gate region is formed during the creation of the first second-conductivity-well. Further, the first-conductivity+ active areas of the LV first-conductivity FET and the HV-first-conductivity FET are formed at the same time.

The integrated circuit may include a self-aligned LV second-conductivity FET transistor having second-conductivity+ active areas formed in a first first-conductivity-well. In addition, the integrated circuit may include a non self-aligned HV-second-conductivity FET transistor formed in a second first-conductivity-well wherein a drain region is defined by a degraded lightly doped second-conductivity-drift regions formed by a sequential chained implant used to form the channel stops and a second-conductivity+ active area defined by a first spacer spanning the drain region and partially the gate region of the HV-second-conductivity FET.

In other embodiments, an IC may include a high voltage first-conductivity type field effect transistor (HV-first-conductivity FET) that has a second-conductivity-well and a field oxide formed over the second-conductivity-well to define an active area. A first-conductivity-well is formed in at least a portion of the active area, wherein the first-conductivity-well is formed to have the capability to operate as a first-conductivity-drift portion of the HV-first-conductivity FET. A gate oxide is formed over the second-conductivity-well and a portion of the first-conductivity-well in the active area. Further, a plurality of spacers are formed on opposing sides of the gate oxide, at least one spacer defines an opening over the first-conductivity-well, the opening having a first-conductivity+ implant in the first-conductivity-well. The IC may optionally or in addition further include a high voltage second-type field effect transistor (HV-second-conductivity FET). The HV-second-conductivity FET has a first-conductivity-well and a field oxide formed over the first-conductivity-well to define an active area. A channel stop region is formed in at least a portion of the active area, wherein the channel stop region has the capability to operate as second-conductivity-drift portions of the HV-second-conductivity FET. The gate oxide is also formed over the first-conductivity-well and a portion of the channel stop region in the active area. A plurality of spacers are formed on opposing sides of the gate oxide. At least one spacer defines an opening over the channel stop region, the opening having a second-conductivity+ implant in the channel stop region.

The HV-first-conductivity FET may include a second first-conductivity-well formed in at least a portion of the active area, wherein the second first-conductivity-well is formed to have the capability to operate as a first-conductivity-drift portion of the HV-first-conductivity FET. Also, a second spacer defines a second opening over the second first-conductivity-well, the second opening having a second first-conductivity+ implant in the second first-conductivity-well. The gate oxide is further formed over a portion of the second first-conductivity-well.

Alternatively, the HV-first-conductivity FET may include a second first-conductivity+ implant in the active area of the second-conductivity-well, and wherein the gate region is formed over a portion of the second first-conductivity+ implant. A second spacer is disposed adjacent to the second first-conductivity+ implant. A low density diffusion implant is disposed under the gate oxide and adjacent to the second first-conductivity+ implant.

The HV-second-conductivity FET may include a second channel stop region formed in at least a portion of the active area, wherein the second channel stop region is formed to have the capability to operate as a second-conductivity-drift portion of the HV-second-conductivity FET. In addition, a second spacer defines a second opening over the second channel stop region, the second opening having a second second-conductivity+ implant in the second channel stop region. The gate oxide is further formed over a portion of the second channel stop region.

Alternatively, the HV-second-conductivity FET may include a second second-conductivity+ implant in the active area of the first-conductivity-well. In addition, the gate region is formed over a portion of the second second-conductivity+ implant. A second spacer is disposed adjacent to the second second-conductivity+ implant.

Thus, the IC may include a set of self aligned transistors of at least one of group consisting of LV first-conductivity FET and LV second-conductivity FET transistors. In addition, the LV first-conductivity FET and LV second-conductivity FET transistors have a drain to source breakdown of less then about 7V. Further, the IC may include a set of non-self aligned high voltage transistors with different widths and lengths.

Figure 11:
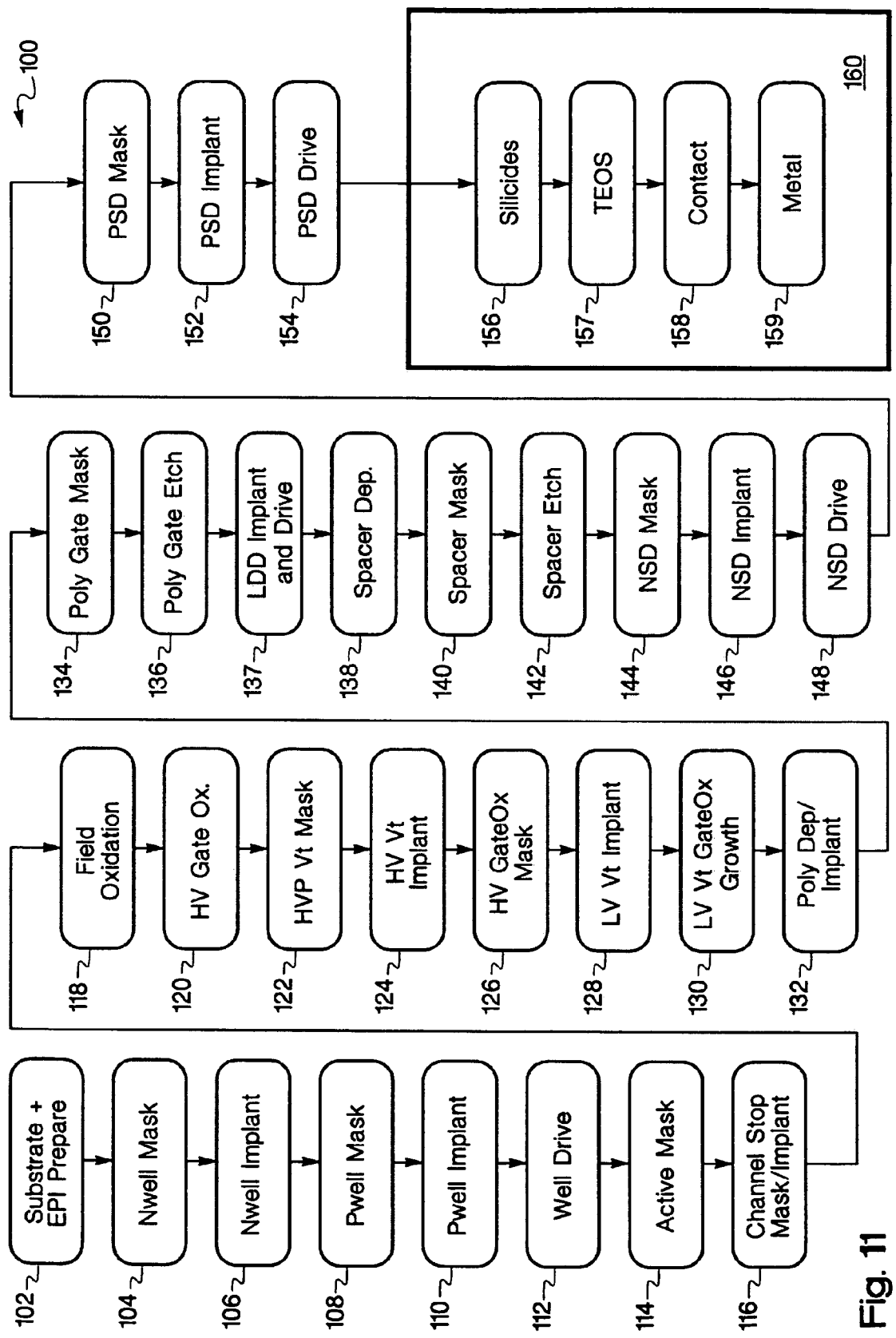
FIG. 11 is a flow chart of an exemplary embodiment of a process used to create various embodiments of MOSFET transistors in one common chip.

Exemplary Processes:

FIG. 11 is a block diagram of the process steps of an exemplary process 100 which is used to create the LVCMOS and the HVCMOS devices on the same substrate. This exemplary process 100 follows a conventional LVCMOS process flow but several steps are modified to allow for the HVCMOS device creation. In addition, some steps (such as, HV Gate Ox (step 120), HV Vt adjust implant (step 124), HV Gate Ox mask (step 126)) are optional and can be eliminated based on the required performance of the devices. For example, the HV Gate Ox and HV Gate Ox mask may be eliminated if only higher breakdown voltage between the drain and source of HVMOS is required, which means the high voltage transistors will have the same thickness of gate oxide as low voltage FETs and can operate at the same gate stress as well.

Figure 12C:
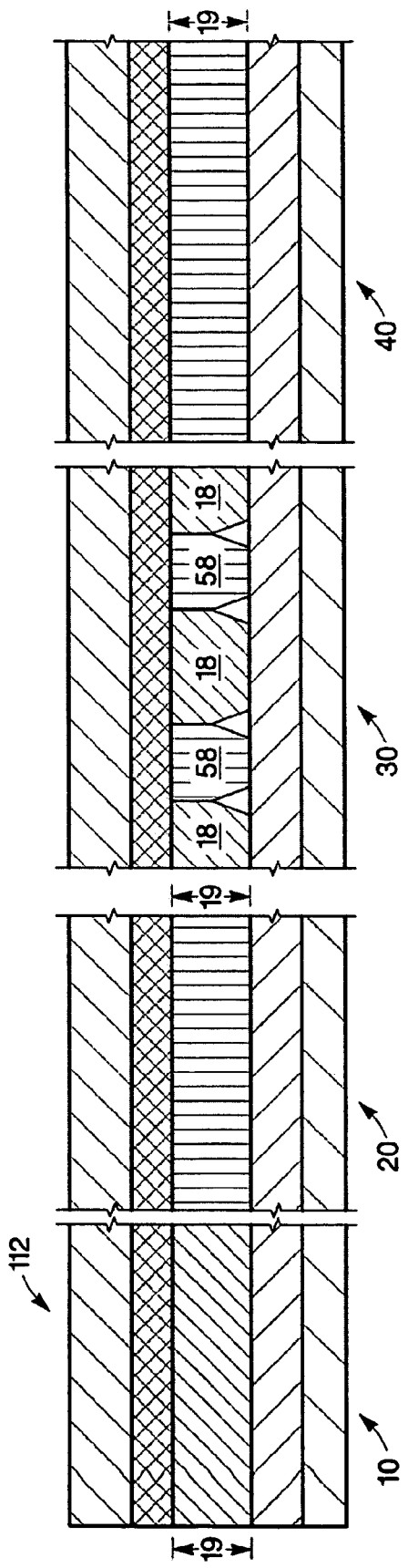
FIGS. 12A-12N are exemplary cross-sections of embodiments of LVNMOS, LVPMOS, HVNMOS, and HVPMOS transistors being formed in various steps of the exemplary process of FIG. 11.
Figure 12D:
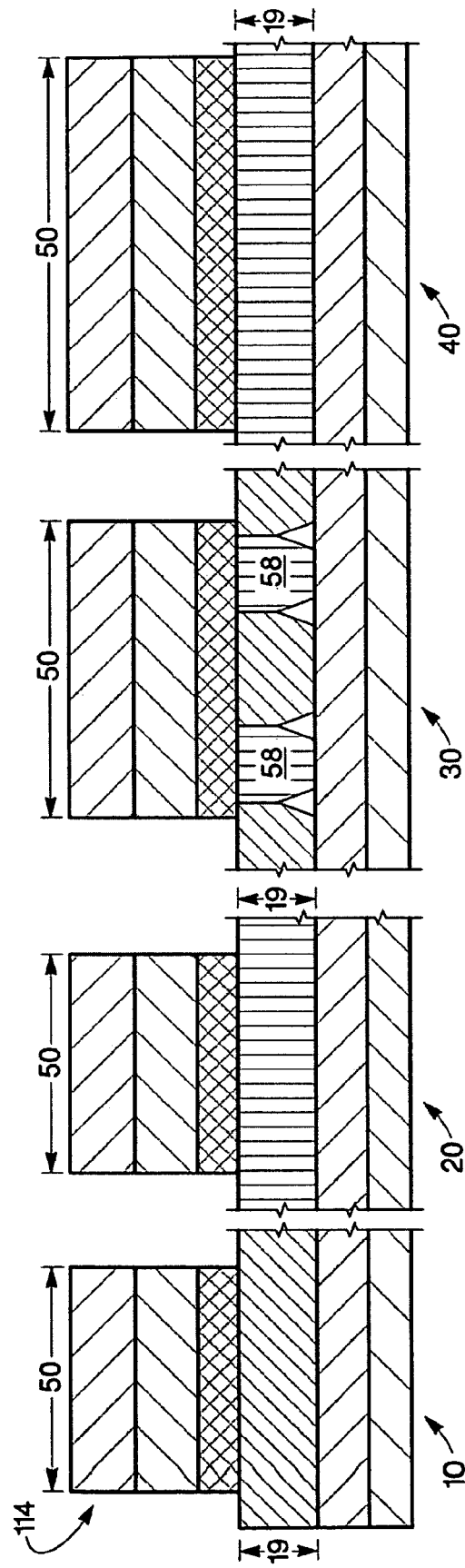
Figure 12I:
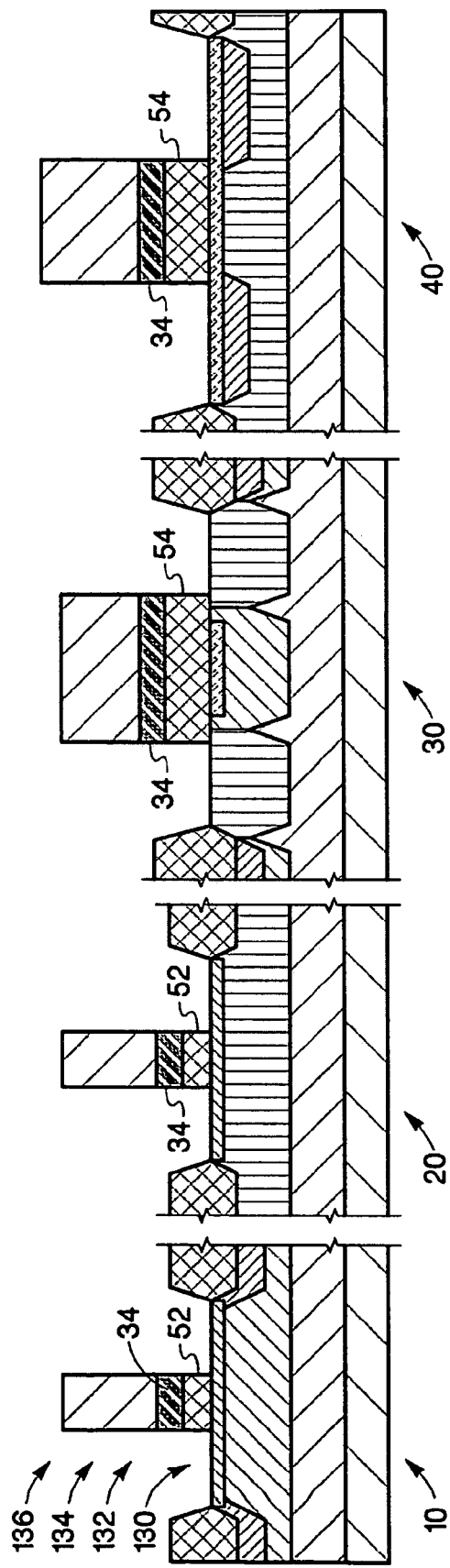
Figure 12J:
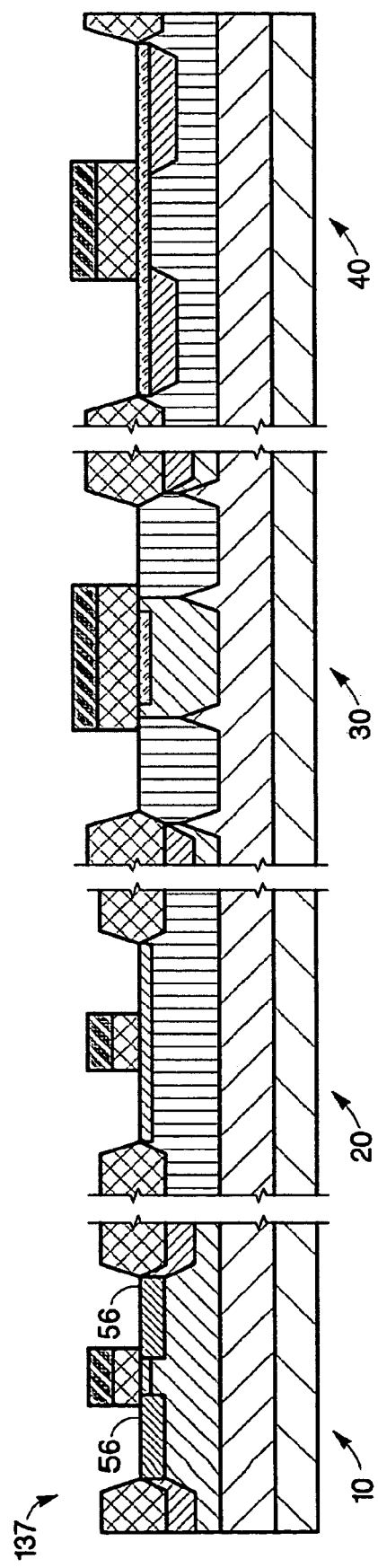
Figure 12M:
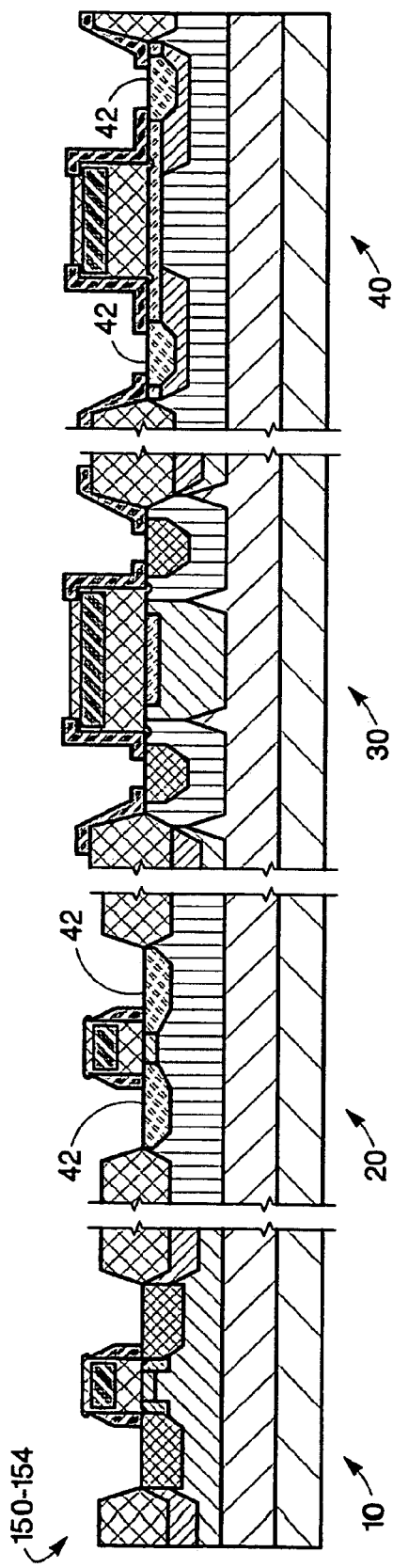
Figure 12N:
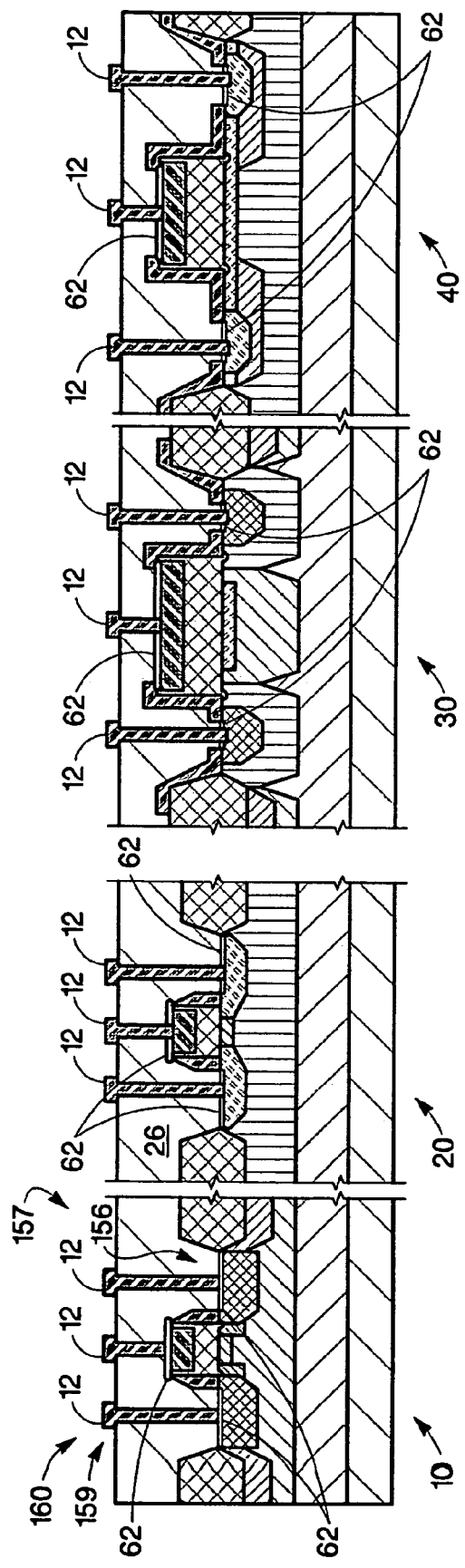

FIGS. 12A-12N illustrate various cross-sections or cutouts of the wafer for a LVNMOS 10, LVPMOS 20, HVNMOS 30, and HVPMOS 40 device during several intermediate steps of the process. Additionally, other devices can be created by the process through the layout of the various mask steps, but these four exemplary devices are shown to best illustrate the various features of the invention. The description of FIG. 11 is combined into the description of the various views of FIGS. 12A-12N. Although exemplary doping concentrations, chemicals, energy levels, film thicknesses, and the like are described to enable the invention, those of skill in the art may modify the various exemplary numbers and appropriate chemicals given and still meet the spirit and scope of the invention.

FIG. 12A illustrates preparation of the substrate 15 (step 102), a silicon substrate, shown as having a P+ base 14 and a P− epi layer 16. A 165 A (Angstrom) oxide growth is performed prior to the application of an N-well photo mask (step 104). The thin 165 A of oxide growth is done to protect the surface of the substrate 15 during the N-well (step 106) and P-well (step 110; FIG. 12B) implantation steps. This thin oxide layer also is used as a stress-relief oxide for the nitride film that is applied later during the active area 50 definition. For the conventional LVCMOS process, the N-well is formed in the P− epi layer 16 for the LVPMOS 20 device. To create the HVNMOS 30 device, the N-well mask layout is modified in this embodiment to add at least one additional feature n-drift region in the active area 50. Also, an N-well for the HVPMOS 40 device is added to the mask layout.

Conventional LVCMOS process layout rules do not allow for the N-well to be used for the n-drift region. Therefore, the mask design rules are accordingly changed based on the consideration of the effective channel length of the HVNMOS, as well as the sum of the depletion region widths in the n-drift region in order for punch-through to be avoided. The N-well mask has LVPMOS 20 definitions 70, HVPMOS 40 definitions 74, and HVNMOS 30 n-drift region definitions 72. After the N-well implant step 106, the P− epi layer 16 has N-well regions 38 in the LVPMOS 20, HVNMOS 30, and HVPMOS 40. A typical N-well implantation (step 106) would be a dose of about $1.9 \times 10^{13}$ atoms/cm$^2$ of phosphorous at an energy of 150 KeV.

In FIG. 12B, a P-well mask is applied (step 108) to create P-well definitions 76, 78, 80. The P-well implant (step 110) is performed to create the P-wells in the substrate 15. In the conventional LVCMOS process, the P-well is formed in the P− epi layer 16 for the LVNMOS 10 device. For the HVNMOS 30 device, the P-well mask layout is modified to both protect the additional n-drift regions implanted by the N-well implant (step 106) and to create P-well regions 18 in the gate region and areas surrounding the active area 50 of the device. Thus, the P-well mask has LVNMOS 10 P-well definition 76, HVNMOS 30 n-drift mask definition 80 and HVNMOS 30 P-well definitions 78. Conventional LVCMOS layout rules are not applicable to the HVNMOS device region and new rules are created based on consideration of the effective channel length of the HVNMOS, as well as the sum of the depletion region widths in the n-drift region in order for source-drain punch-through to be avoided. An exemplary P-well implant (step 110) would be about $1.85 \times 10^{13}$ atoms/cm$^2$ of boron at 130 KeV.

In FIG. 12C, a 2000 A nitride deposition is performed prior to the P-well and N-well drive in (step 112). The P-well and N-wells are driven in during an approximate 5 hour bake at 1100 C. The resulting depth 19 of the both the P-well and N-well is about 2 to 2.5 micrometers (um). The resulting approximate doping concentration of the wells are about $1\times10^{17}$ cm$^{-3}$. During well drive-in of step 112, the n-drift region 58 for the HVNMOS 30 is created between the P-well regions of the device.

In FIG. 12D, the active area definition mask is applied (step 114) to define the active areas 50 of the various devices. Then the 2000A nitride layer and 165A thin oxide layer are etched away where there are no active areas 50.

In FIG. 12E, a channel stop photo mask is applied and defined to create channel stop definitions 23 to create channel stop regions 22 in the LVNMOS 10, HVNMOS 30 and to create the p-drift definitions 60 for the p-drift implants 44. Normally, the channel stop mask covers the entire active area 50 as shown for the LVNMOS 10, LVPMOS 20, and HVNMOS 30. However, for the HVPMOS 40 device, the photoresist used as the mask for the p-drift definitions is opened over the active area 50 of the HVPMOS 40 to create the p-drift definitions 60. For the LVNMOS 10 and HVNMOS 30, the channel stop implant of boron (step 116) is used to provide adequate insulation between PMOS and NMOS devices. A typical exemplary conventional dosing is $3\times10^{13}$ atoms/cm$^2$ of boron at an energy of 30 KeV. The implanted dopants are then diffused to the desired depth. However, to allow for the creation of the HVPMOS 40 device, the conventional channel stop implant is modified to be a sequential chain implant of various energies from high to low energy. For instance, because of the 2000A nitride layer and the 165 A thin oxide layer over the active area 50 of the HVPMOS 40 device, the energy level of the implant is increased to 250 KeV at a dose of $2\times10^{12}$ atoms/cm$^2$. Additional high energy implants may be performed to provide further gradation of the doping of the p-drift region 44. For instance, a second high energy dose at 180 KeV at a dose of $2\times10^{12}$ atoms/cm$^2$ and a third high energy dose at 130 KeV at a dose of $1.5\times10^{13}$ atoms/cm$^2$ may be included in the sequential chain implant (step 116). Only these high energy dose implants are able to penetrate or partially penetrate through the nitride layer to form a degraded lightly-doped p-drift region 44. After the high energy doses, a low energy boron dose at 30 KeV at a dose of $3\times10^{13}$ at/cm$^2$ is performed in the sequential chain implant (step 116) to provide the proper doping for the channel stops in the LVNMOS 10 and HVNMOS 30 devices. Thus, the low energy dose serves as the channel stop in the field oxide region 24 and is blocked by the nitride layer in the p-drift region 44.

In FIG. 12F the channel stop photomask is stripped while the 2000 A nitride layer is kept. The substrate 15 is baked at 950 C to grow the field oxide layer (FOX) 24 to a depth of 5000A (step 118) while keeping the oxide over the active area 50 at 165A. During this bake, the channel stops 22 and p-drift region 44 are driven into the substrate to a depth of about 0.6 um. The approximate doping concentration is on the order of $1\times10^{17}$ cm$^{-3}$ for the p-drift region formed by the sequential chain implant.

In FIG. 12G, after the nitride layer is stripped, the HV gate oxide is grown to 240A (step 120) and a HV Vt adjust definition mask is applied (step 122). To allow for integration of the HVMOS with the LVMOS devices, the HVMOS devices are allowed to have a thicker gate oxide to allow for high gate to source breakdown. Accordingly, the threshold of the HVMOS transistors may be adjusted with a separate HV Vt adjust implant (step 124) as needed to achieved a particular desired device performance. The 240A gate oxide is a portion of the final HV gate oxide and is used to also act as a screen oxide during the HV Vt adjust implant 48. An exemplary HV Vt adjust implant doping is a dose of boron at 20 KeV at a concentration of $1.5\times10^{12}$ atoms/cm$^2$. The HV Vt implant 48 is performed over the P-well in the gate region of the HVNMOS and over the entire active area 50 of the HVPMOS.

In FIG. 12H, after the HV Vt adjust mask is stripped, a LV Vt adjust mask is applied (step 126) and openings defined over the LVMOS devices. The LV Vt adjust implant (step 128) is performed at an energy of 20 KeV with a dose of about $3.0\times10^{12}$ atoms/cm$^2$ of boron. The LV Vt adjust implant 46 is performed over the entire active areas 50 of the LVMOS devices. After the LV Vt adjust implant 46, the 240 A oxide is removed for the LVMOS region but not the HVMOS regions.

In FIG. 12I, the LV gate oxide 52 is grown or otherwise applied (step 130) to 90 A and it also increases the HV gate oxide 54 in the HVMOS region to about 300 A. Then, a 3600A layer of polysilicon is applied by deposition (step 132). On the polysilicon layer a poly gate mask layer is applied (step 134) and etched (step 136) to define the gate regions 34. Exemplary minimum gate lengths are 0.5 um for the LVMOS and 2.2 um for the HVMOS devices.

In FIG. 12J, a low density drain (LDD) diffusion is implanted and driven in (step 137) for the LVNMOS 10 device in the source and drain regions around the gate region 34. An LDD implant photo mask is applied everywhere except the drain and source regions of the LVNMOS 10. A typical dose is a 20 KeV dose of about $4.0\times10^{13}$ atoms/cm$^2$ of phosphorous is implanted. The LDD implant 56 is then typically driven in about 20 min at 950 C.

FIG. 12K illustrates the result of spacer deposition (step 138), spacer mask (step 140), and spacer etch (step 142) steps to create spacers 28. The spacers 28 on the LVMOS devices are on opposing sides of the LV gate oxide 52 and poly gates 34. The spacers 28 on the HVMOS devices span from the FOX 24 to over a portion of the gate 34 and define an opening 29 over the source and drain regions of the device to allow for the appropriate N+ or P+ implant. For the HVNMOS device, the openings 29 in the spacers 28 are over the n-drift regions and for the HVPMOS device, the openings 29 are over the p-drift regions. The spacers 28 may be formed by a 2000 A nitride deposition. These nitride spacers 28 act as a hard mask to protect the lightly doped n-drift and p-drift regions during the N+ and P+ implants (steps 146, 152 respectively; FIG. 11) and silicide creation (step 156; FIG. 11).

FIG. 12L illustrates the results of the N+ implants for the source and drains which occurs from the NSD mask (step 144), NSD Implant (step 146), and NSD drive (step 148) steps. In step 144, an N+ photo mask is applied to protect those regions where the implant is not desired. In step 146, the N+ implant is performed with a 50 KeV dose of arsenic at about $3\times10^{15}$ atoms/cm$^2$. In step 148, the arsenic is driven into the substrate 15 for about 60 min. at 950 C in a nitrogen atmosphere. This results in a doping level on the order of $1\times10^{20}$ cm$^{-3}$. As shown, the N+ implant 36 is applied to the LVNMOS 10 and the HVNMOS 30 in the source and drain regions. In particular for the HVNMOS 30 device, the N+ implants are surrounded by the n-drift regions 58.

FIG. 12M illustrates the results of the P+ implants for the source and drains which occurs from the PSD mask (step 150), PSD Implant (step 152), and PSD drive (step 154) steps. In step 150, a P+ photo mask is applied to protect those regions where the implant is not desired. In step 152, the P+ implant is performed with a 50 KeV dose of BF$_2$ (boron diflouride) at about $2\times10^{15}$ atoms/cm$^2$. In step 154, the BF$_2$ is driven into the substrate 15 for about 30 min. at 900 C in a nitrogen atmosphere. This results in a doping level on the order of $1\times10^{20}$ cm$^{-3}$. As shown, the P+ implant 42 is applied to the LVPMOS 20 and the HVPMOS 40 in the source and drain regions. In particular for the HVPMOS 40 device, the P+ implants are surrounded by the p-drift regions 44.

FIG. 12N illustrates the results of the remaining finishing steps 160 before any additional metal layers or MEMs processing or other integral fabrication is performed. A silicide layer is created (step 156) to help provide contact to the source, gate, and drain areas of each device. A TEOS 26 or other insulating layer is deposited or otherwise applied (step 157) across the substrate to provide a surface that can be planarized for additional layers. Contact holes are etched (step 158) in the TEOS layer 26 to allow for contact to the silicides 62 on the source, gate and drain regions. Finally, a metal layer 12 is applied (step 159) to fill the contacts 32 and allow for interconnection of the various devices formed on the integrated circuit substrate 15.

Figure 13:
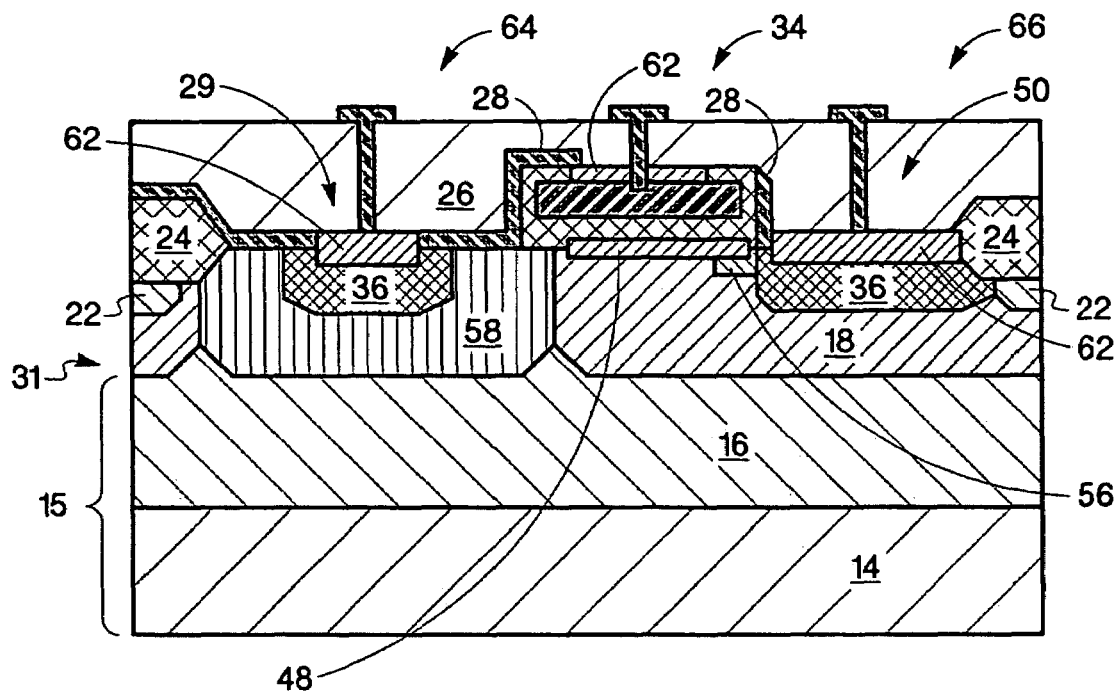
FIG. 13 is an exemplary cross-section of an embodiment of an asymmetrical HVNMOS which can be created by the process of FIGS. 11 and 12A-12N.

FIG. 13 illustrates a cross-section or cut-away view of an exemplary asymmetric HVNMOS transistor 31 which can be formed from the above mentioned process 100 by changing the layout of the masks. Asymmetrical transistors have the source 66 and drain 64 dedicated and can be a smaller device than a symmetrical HVNMOS transistor 30 as shown in FIG. 3. The drain 64 has its n-drift region 58 formed by an N-well implant at the same time as the N-well is created by the LVNMOS transistor 10. The source 66 has an N+ implant 36 formed in the P-well 18. The drain 64 also has an N+ implant 36 formed in the n-drift region 58. The location of the N+ implant 36 is defined by opening 29 in the spacer 28 for the drain 64 and between the opposing spacing 28 on the other side of gate 34 and the FOX 24. Silicides 62 are formed on the N+ implants 36 and the gate 34 to provide for contacts the metal layers. A layer of TEOS 26 is used to form a planar surface for the addition of additional metal layers or other fabrication such as with MEMs devices or thermal inkjet components. A channel stop 22 is disposed around the active region 50 of the transistor to provide isolation from other transistors. An HV Vt adjust implant 48 is disposed beneath the HV gate oxide 54. The source 66 has the N− LDD implant performed on it, leaving a small N− LDD region 56 beneath the HV Vt adjust implant 48.

Figure 14:
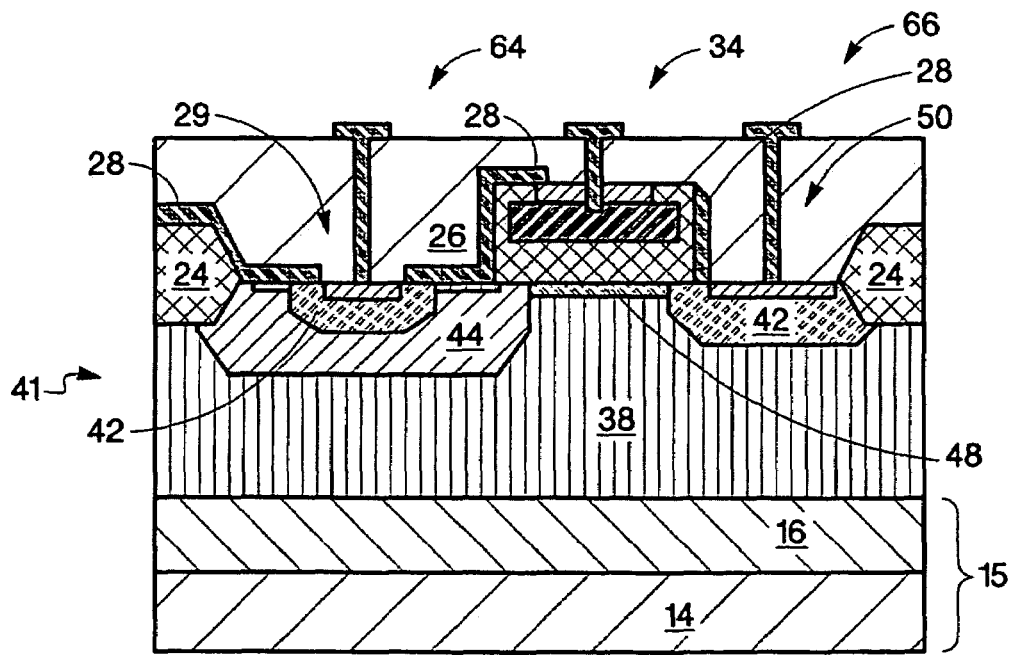
FIG. 14 is an exemplary cross-section of an embodiment of an asymmetrical HVPMOS which can be created by the process of FIGS. 11 and 12A-12N.

FIG. 14 is an illustration of an asymmetric HVPMOS transistor 41 which can be fabricated with the exemplary process 100 by modifying the layout of the various masks. In this transistor, the source 66 is formed by a P+ implant into the N-well 38 in the active area 50. The drain 64 has a P+ implant 42 formed in a p-drift region 44. The P+ implant 42 of the drain 64 is defined by an opening 29 in the spacers 28. An opposing spacer 28 on the other side of gate 34 and the FOX 24 region define the source 66. An HV Vt adjust implant 48 is disposed beneath the HV gate oxide 54. A TEOS layer 26 is used to form an insulating and planar surface for additional processing.

Figure 15:
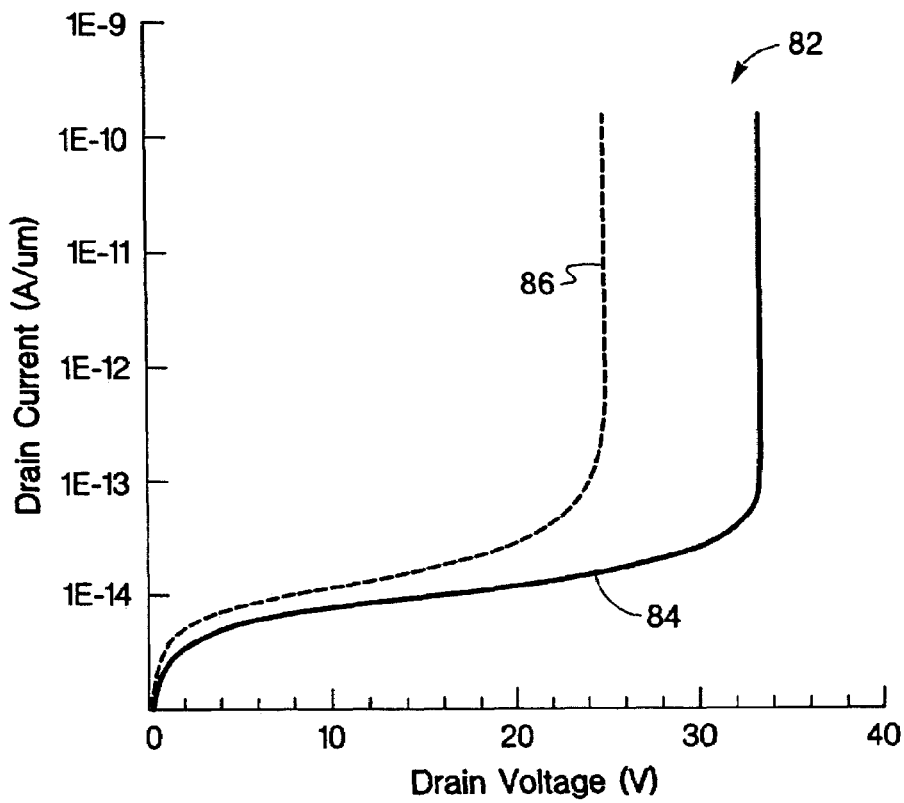
FIG. 15 is an exemplary graph showing the relative breakdown characteristics for a HVNMOS transistor of an exemplary embodiment using the exemplary process and of a typical HVNMOS transistor using a conventional process.

FIG. 15 is an exemplary graph illustrating the HVNMOS 30 breakdown characteristics. The horizontal axis represents the drain to source voltage and the vertical axis represents the drain current in Amps/um. Line 86 represents the simulation of a conventional process which uses additional n-drift implants for the HVNMOS 30 transistor. Line 84 represents the simulation of an HVNMOS 30 transistor which uses a modified process (such as process 100) to form the n-drift region using an N-well at the same time that the N-wells for the LVPMOS transistors are created. As shown, the modified process has a higher (about 34V) breakdown than the conventional process breakdown voltage (about 25V). Of course, those of skill in the art could vary the various doping levels, energies, and bake times to modify the breakdown voltage level.

Figure 16:
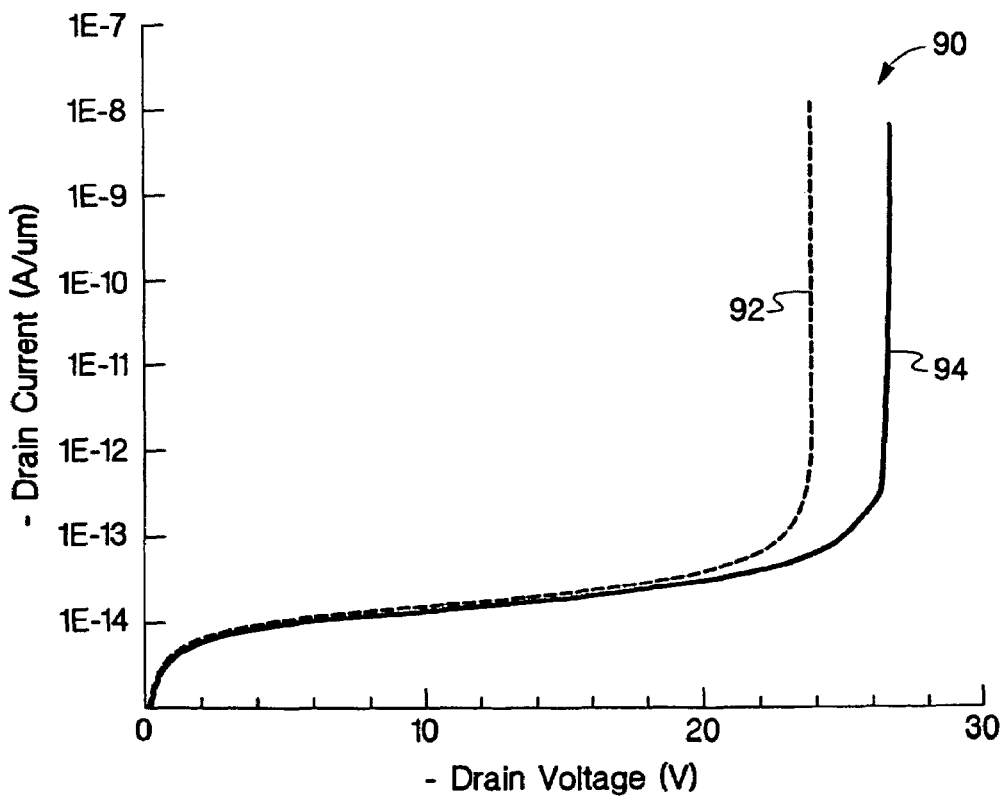
FIG. 16 is an exemplary graph showing the relative breakdown characteristics for a HVPMOS transistor of an exemplary embodiment using the exemplary process and of a typical HVPMOS transistor using a conventional process.

FIG. 16 is an exemplary graph illustrating the HVPMOS 40 breakdown characteristics. The horizontal axis represents the drain to source voltage and the vertical axis represents the drain current in Amps/um. Line 94 represents the simulation of an HVPMOS 40 transistor which uses a modified process (such as process 100) to form the p-drift region using a sequential chain implant and modified masking structure over the p-drift regions. Line 92 represents the simulation of a conventional process that uses a separate p-drift implant step to create the p-drift region for the HVPMOS transistor 40. As shown, in this example, the modified process has a slightly higher breakdown voltage (about 26V) than the breakdown voltage of the conventional HVPMOS transistor 40 (about 24V). Of course, this is just an example, and the process doping levels and energies as well as bake times and temperatures can be modified during the sequential chain implant step to increase or decrease the breakdown threshold level.

The modified process thus is a method of forming a high voltage first conductivity metal oxide semiconductor field effect transistor (HVMOS) by forming one or more first conductivity-well regions in an active area defined by an opening in a field oxide region over a second conductivity-well, wherein the first conductivity-well regions are formed to include first conductivity-drift capabilities. Further, a gate oxide region is formed over the second conductivity-well in the active area and a portion of the one or more first conductivity-well regions. The HVMOS transistor is further formed by applying a plurality of spacers on opposing sides of the gate oxide region, wherein one or more spacers define an opening to the first conductivity-well regions. First conductivity+ dopant is then implanted in the one or more openings of the spacers. To make an asymmetrical HVMOS transistor, the first conductivity source regions are formed in the active area of the second conductivity-well, wherein the first conductivity+ source regions are formed to span from beneath the gate oxide to an edge of the active area.

In addition, or in the alternative, a method of forming a high voltage second conductivity-type metal oxide semiconductor field effect transistor (HVMOS) includes forming one or more channel stop regions in an active area defined by an opening in the field oxide region over a first conductivity-well, wherein the channel stop regions are formed to include second conductivity-drift capabilities. A gate oxide region is formed over the first conductivity-well in the active area and a portion of the one or more channel stop regions. In addition, a plurality of spacers is applied on opposing sides of the gate oxide region, wherein one or more spacers define an opening to the channel stop regions. Then, second conductivity+ dopant is applied in the one or more openings of the spacers. Second conductivity+ source regions are formed in the active area of the first conductivity-well, wherein the second conductivity+ source regions are formed to span from beneath the gate oxide to an edge of the active area. The step of forming one or more channel stop regions further includes performing a sequential chain implant of high energy to lower energy dose implants.

The modified process can also be described as creating a high voltage (HV) FET (field effect transistor) with a low voltage (LV) process. This modified process includes modifying a first conductivity-well mask to define first conductivity-drift regions to define a HV drain region in a second conductivity-substrate during the definition of first conductivity-wells in the LV process. A second conductivity-well mask is modified to define a second conductivity-well area adjacent to the HV drain region to create a HV gate region during the definition of the second conductivity-wells in the LV process. A first gate oxide mask is created for the HV gate region and LV process for threshold adjust implants for the HV gate region and the LV process. A first threshold adjust implant is applied to the HV gate region and a second threshold adjust implant for the LV process. An HV source region is created using the same steps as creating the HV drain region to create a symmetric HV-FET. The LV process is used to create at least one of a set of LV first conductivity FETs and a set of LV second conductivity FETs. Depending on the HVMOS devices performance requirement, both HV and LV FETS may use the same gate oxide, which means the HV gate ox growth, first gate oxide mask can be removed.

A spacer is applied to the LV FETs and the HV-FET wherein the spacer region of the HV-FET spans the HV drain region and a portion of the HV gate region and defines an opening over the HV drain region. A first conductivity+ implant is applied in the opening over the HV drain region during the first conductivity+ implant of the LV process. Optionally to create an asymmetric HV-FET, an HV source region is created by extending the second conductivity-well area used to create the HV gate region and applying the low density diffusion implant in the HV source region before implanting the HV source region with a first conductivity+ implant.

Another modification to the process of a low voltage (LV) process to create a high voltage(HV) FET includes modifying a first conductivity-well mask to define a HV first conductivity-well for the HV-FET in a second conductivity-substrate during the definition of first conductivity-well in the LV process. An HV active area protective mask is defined for the HV-FET during definition of the active area protective masks of the LV process. A channel stop mask is modified and disposed on the active area protective masks to define a second conductivity-drift region in the HV active area. The LV process channel stop implant step is modified to create a sequential chain implant having at least one high energy implant sufficient to penetrate through active area protective mask to create the HV drain region in the defined second conductivity-drift region. A first gate oxide mask is created for a HV gate region and LV process for threshold adjust implants for the HV first conductivity-well and the LV process. A first threshold adjust implant is applied to the HV first conductivity-well and a second threshold adjust implant for the LV process.

To create a symmetrical HV FET, an HV source region is created using the same steps as creating the HV drain region. The LV process can be used to create at least one of a set of LV first conductivity FETs and a set of LV second conductivity FETs. The process may include removing the first gate oxide mask for the LV process and not the HV gate region, and creating a second gate oxide mask for the LV process and the HV gate region. A low density diffusion implant is applied for the LV process and not the HV drain region. A spacer is applied to the LV FETs and the HV-second conductivity FET wherein the spacer region of the HV-second conductivity FET spans a HV drain region and a portion of the HV gate region. The spacer defines an opening over the HV drain region. A second conductivity+ implant is applied in the opening over the HV drain region during the second conductivity+ implant of the LV process.

Alternatively, to create an asymmetrical HV FET, an HV source region is created by not defining the HV source region with the modified channel stop mask which thereby extends the second conductivity-well area used to create the HV gate region and implanting the HV source region with a second conductivity+ implant.

The modified process of using a sequential chain implant includes at least two high energy implants able to at least partially penetrate the active area protective mask to form a degraded lightly-doped second conductivity-drift region and one low energy implant blocked by the active area protective mask. Alternatively, the sequential chain implant includes at least three high energy implants of decreasing energy levels able to at least partially penetrate the active area protective mask to form a degraded lightly-doped second conductivity-drift region and a low energy implant blocked by the active area protective mask. In other words, the sequential chain implant includes at least one high energy implant able to at least partially penetrate the active area protective mask to form a degraded lightly-doped second conductivity-drift region before performing the normal channel stop implant of the LV process.

A LV process may also be modified to create both a high voltage (HV) first conductivity FET and a HV-second conductivity FET by modifying an first conductivity-well mask to define first conductivity-drift regions to define a HV-first conductivity FET drain region and a HV first conductivity-well for the HV-second conductivity FET in a substrate during the definition of first conductivity-wells in the LV process. A second conductivity-well mask is modified to define a second conductivity-well area adjacent to the HV-first conductivity FET drain region to create a HV-first conductivity FET gate region during the definition of the second conductivity-wells in the LV process. A first gate oxide mask is created for the HV-first conductivity FET gate region, the HV-second conductivity FET gate region, and the LV process for threshold adjust implants. An HV active area protective mask is defined for the HV-first conductivity FET and the HV-second conductivity FET during definition of the active area protective masks of the LV process. A channel stop mask is modified and disposed on the active area protective masks to define a second conductivity-drift region in the HV-second conductivity FET active area. The LV process channel stop implant step is modified to create a sequential chain implant having at least one high energy implant sufficient to penetrate through active area protective mask to create an HV-second conductivity FET drain region in the defined second conductivity-drift region. A first threshold adjust implant is applied to the HV-first conductivity FET and the HV-second conductivity FET gate regions and the HV first conductivity-well. A second threshold adjust implant is applied for the LV process. To create a symmetric HV-first conductivity FET, a HV-first conductivity FET source region is created using the same steps as creating the HV-first conductivity FET drain region. The LV process may be used to create at least one of a set of LV first conductivity FETs and a set of LV second conductivity FET transistors. The first gate oxide mask is removed for the LV process and not the HV-first conductivity FET and HV-second conductivity FET gate regions. A second gate oxide mask is created for the LV process and the HV-first conductivity FET and HV-second conductivity FET gate regions. A low density diffusion implant is applied for the LV process and not the HV-first conductivity FET and HV-second conductivity FET drain regions.

A spacer is applied to the LV process and the HV-first conductivity FET and the HV-second conductivity FET wherein the spacer regions of the HV-first conductivity FET and the HV-second conductivity FET spans the HV drain regions and a portion of the HV gate regions and defines a set of openings over the HV drain regions. An first conductivity+ implant is implanted in the set of openings over the HV-first conductivity FET drain regions during the first conductivity+ implant of the LV process. A second conductivity+ implant is implanted in the set of openings over the HV-second conductivity FET drain regions during the second conductivity+ implant of the LV process.

Alternatively, to create an asymmetrical HV-first conductivity FET, a HV-first conductivity FET source region is created by extending the second conductivity-well area used to create the HV-first conductivity FET gate region and applying the low density diffusion implant in the HV-first conductivity FET source region before implanting the HV-first conductivity FET source region with an first conductivity+ implant.

To create a symmetric HV-second conductivity FET, an HV-second conductivity FET source region is created using the same steps as creating the HV-second conductivity FET drain region.

To create an asymmetric HV-second conductivity FET, an EV-second conductivity FET source region is created by not defining the HV-second conductivity FET source region with the modified channel stop mask thereby extending the second conductivity-well area used to create the HV-second conductivity FET gate region and implanting the HV-second conductivity FET source region with a second conductivity+ implant.

In one embodiment, the sequential chain implant includes at least two high energy implants able to at least partially penetrate the active area protective mask to form a degraded lightly-doped second conductivity-drift region and one low energy implant blocked by the active area protective mask. In another embodiment, the sequential chain implant includes at least three high energy implants of decreasing energy levels able to at least partially penetrate the active area protective mask to form a degraded lightly-doped second conductivity-drift region and a low energy implant blocked by the active area protective mask. Thus, the sequential chain implant includes at least one high energy implant able to at least partially penetrate the active area protective mask to form a degraded lightly-doped second conductivity-drift region before performing the normal channel stop implant of the LV process.

While the present invention has been particularly shown and described with reference to the foregoing preferred and alternative embodiments, those skilled in the art will understand that many variations may be made therein without departing from the spirit and scope of the invention as defined in the following claims. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. An integrated circuit having a set of first-conductivity-wells and second-conductivity-wells formed on a substrate, comprising:
   a self-aligned LV first-conductivity FET transistor having first-conductivity+ active areas and a set of channel stops formed in a first second-conductivity-well; and
   a non self-aligned HV-second-conductivity FET transistor formed in a second first-conductivity-well wherein a drain region is defined by a degraded lightly doped second-conductivity-drift regions formed by a chained implant used to form the channel stops and a second-conductivity+ active area defined by a first spacer spanning the drain region and partially the gate region of the HV-second-conductivity FET.

2. The integrated circuit of claim 1, further comprising:
   a self-aligned LV second-conductivity FET transistor having second-conductivity+ active areas formed in a first first-conductivity-well.

3. The integrated circuit of claim 1, further comprising:
   a non self-aligned HV-first-conductivity FET transistor formed in a second second-conductivity-well wherein a drain region is defined by a first-conductivity-drift region formed during the creation of the set of first-conductivity-wells and a first-conductivity+ active area defined by a spacer spanning the drain region and partially a gate region, and wherein the gate region is formed during the creation of the first second-conductivity-well and wherein the first-conductivity+ active areas of the LV first-conductivity FET and the HV-first-conductivity FET are formed at the same time.

4. The integrated circuit of claim 2 wherein the LV first-conductivity FET and LV second-conductivity FET transistors have a drain to source breakdown of less then about 7V.

5. The integrated circuit of claim 3 wherein the HV-second-conductivity FET and the HV-first-conductivity FET transistors have a drain to source breakdown of greater than about 20V.

6. A high voltage first-conductivity type field effect transistor (HV-first-conductivity FET), comprising:
   a second-conductivity-well;
   a field oxide formed over the second-conductivity-well defining an active area;
   a first-conductivity-well formed in at least a portion of the active area, wherein the first-conductivity-well is formed of chained implants to create a degraded lightly-doped first conductivity drift region to have the capability to operate as a first-conductivity-drift portion of the HV-first-conductivity FET,
   a gate oxide formed over the second-conductivity-well and a portion of the first-conductivity-well in the active area; and
   a plurality of spacers formed on opposing sides of the gate oxide, a spacer defining an opening over the first-conductivity-well, the opening having a first-conductivity+ implant in the first-conductivity-well.

7. The HV-first-conductivity FET of claim 6, further comprising:
   a second first-conductivity-well formed in at least a portion of the active area, wherein the second first-conductivity-well is formed of chained implants to create a degraded lightly-doped first conductivity drift region to have the capability to operate as a first-conductivity-drift portion of the HV-first-conductivity FET;
   a second spacer defining a second opening over the second first-conductivity-well, the second opening having a second first-conductivity+ implant in the second first-conductivity-well; and
   wherein the gate oxide is further formed over a portion of the second first-conductivity-well.

8. The HV-first-conductivity FET of claim 6, further comprising:
   a second first-conductivity+ implant in the active area of the second-conductivity-well, and wherein the gate region is formed over a portion of the second first-conductivity+ implant;
   a second spacer adjacent to the second first-conductivity+ implant; and
   a low density diffusion implant under the gate oxide and adjacent to the second first-conductivity+ implant.

9. A high voltage first conductivity-type field effect transistor (HV-first-conductivity FET), comprising:
a second-conductivity-well;
a field oxide formed over the second-conductivity-well defining an active area;
a channel stop region formed in at least a portion of the active area, wherein the channel stop region is formed chained implants to create a degraded lightly-doped first conductivity drift region to have the capability to operate as first-conductivity-drift portions of the HV-first-conductivity FET,
a gate oxide formed over the second-conductivity-well and a portion of the channel stop region in the active area; and
a plurality of spacers formed on opposing sides of the gate oxide, a spacer defining an opening over the channel stop region, the opening having a first-conductivity+ implant in the channel stop region.

10. The HV-first-conductivity FET of claim 9, further comprising:
a second channel stop region formed in at least a portion of the active area, wherein the second channel stop region is formed of chained implants to create a degraded lightly-doped first conductivity drift region to have the capability to operate as a first-conductivity-drift portion of the HV-first-conductivity FET;
a second spacer defining a second opening over the second channel stop region, the second opening having a second first-conductivity+ implant in the second channel stop region; and
wherein the gate oxide is further formed over a portion of the second channel stop region.

11. The HV-first-conductivity FET of claim 9, further comprising:
a second first-conductivity+ implant in the active area of the second-conductivity-well, and wherein the gate region is formed over a portion of the second first-conductivity+ implant; and
a second spacer adjacent to the second first-conductivity+ implant.

12. An integrated circuit (IC), comprising:
a high voltage first-conductivity type field effect transistor (HV-first-conductivity FET), including:
a second-conductivity-well;
a field oxide formed over the second-conductivity-well defining an active area;
a first-conductivity-well formed in at least a portion of the active area, wherein the first-conductivity-well is formed to have the capability to operate as a first-conductivity-drift portion of the HV-first-conductivity FET,
a gate oxide formed over the second-conductivity-well and a portion of the first-conductivity-well in the active area; and
a plurality of spacers formed on opposing sides of the gate oxide, a spacer defining an opening over the first-conductivity-well, the opening having a first-conductivity+ implant in the first-conductivity-well; and
a high voltage second-type field effect transistor (HV-second-conductivity FET), including:
a first-conductivity-well;
a field oxide formed over the first-conductivity-well defining an active area;
a channel stop region formed in at least a portion of the active area, wherein the channel stop region is formed of chained implants to create a degraded lightly-doped first conductivity drift region to have the capability to operate as second-conductivity-drift portions of the HV-second-conductivity FET,
a gate oxide formed over the first-conductivity-well and a portion of the channel stop region in the active area; and
a plurality of spacers formed on opposing sides of the gate oxide, a spacer defining an opening over the channel stop region, the opening having a second-conductivity+ implant in the channel stop region.

13. The IC of claim 12 wherein the HV-first-conductivity FET, further includes:
a second first-conductivity-well formed in at least a portion of the active area, wherein the second first-conductivity-well is formed to have the capability to operate as a first-conductivity-drift portion of the HV-first-conductivity FET;
a second spacer defining a second opening over the second first-conductivity-well, the second opening having a second first-conductivity+ implant in the second first-conductivity-well; and
wherein the gate oxide is further formed over a portion of the second first-conductivity-well.

14. The IC of claim 12 wherein the HV-first-conductivity FET, further includes:
a second first-conductivity+ implant in the active area of the second-conductivity-well, and wherein the gate region is formed over a portion of the second first-conductivity+ implant;
a second spacer adjacent to the second first-conductivity+ implant; and
a low density diffusion implant under the gate oxide and adjacent to the second first-conductivity+ implant.

15. The IC of claim 12 wherein the HV-second-conductivity FET, further includes:
a second channel stop region formed in at least a portion of the active area, wherein the second channel stop region is formed of chained implants to create a degraded lightly-doped first conductivity drift region to have the capability to operate as a second-conductivity-drift portion of the HV-second-conductivity FET;
a second spacer defining a second opening over the second channel stop region, the second opening having a second second-conductivity+ implant in the second channel stop region; and
wherein the gate oxide is further formed over a portion of the second channel stop region.

16. The IC of claim 12 wherein the HV-second-conductivity FET, further includes:
a second second-conductivity+ implant in the active area of the first-conductivity-well, and wherein the gate region is formed over a portion of the second second-conductivity+ implant; and
a second spacer adjacent to the second second-conductivity+ implant.

17. The IC of claim 12, further comprising:
a set of self aligned transistors of at least one of group consisting of LV first-conductivity FET and LV second-conductivity FET transistors, wherein the LV first-conductivity FET and LV second-conductivity FET transistors have a drain to source breakdown of less then about 7V.

* * * * *

UNITED STATES PATENT AND TRADEMARK OFFICE
CERTIFICATE OF CORRECTION

PATENT NO. : 7,491,595 B2  
APPLICATION NO. : 11/176033  
DATED : February 17, 2009  
INVENTOR(S) : Chin Huang et al.

Page 1 of 1

It is certified that error appears in the above-identified patent and that said Letters Patent is hereby corrected as shown below:

In column 15, line 11, delete "EV" and insert -- HV --, therefor.

In column 16, line 19, in Claim 4, delete "then" and insert -- than --, therefor.

In column 17, line 7, in Claim 9, after "formed" insert -- of --.

In column 18, line 63, in Claim 17, delete "then" and insert -- than --, therefor.

Signed and Sealed this

Second Day of June, 2009

JOHN DOLL  
*Acting Director of the United States Patent and Trademark Office*